(12) United States Patent
Yamazaki

(10) Patent No.: US 7,001,829 B1
(45) Date of Patent: Feb. 21, 2006

(54) SEMICONDUCTOR DEVICE AND METHOD OF MANUFACTURING THE SAME

(75) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/327,469

(22) Filed: Jun. 8, 1999

(30) Foreign Application Priority Data

Jun. 12, 1998 (JP) .......................................... 10-165447

(51) Int. Cl.
*H01L 21/20* (2006.01)

(52) U.S. Cl. .................... 438/479; 438/486; 438/487
(58) Field of Classification Search ................ 438/479, 438/486–489, 903, 29, 39, 164–166; 117/2, 117/3, 8, 565
See application file for complete search history.

(56) References Cited

U.S. PATENT DOCUMENTS

| | | | |
|---|---|---|---|
| 5,529,951 A | 6/1996 | Noguchi et al. | |
| 5,533,040 A | 7/1996 | Zhang | |
| 5,569,610 A | 10/1996 | Zhang et al. | |
| 5,614,733 A | 3/1997 | Zhang et al. | |
| 5,648,277 A | 7/1997 | Zhang et al. | |
| 5,783,468 A | 7/1998 | Zhang et al. | |
| 5,830,784 A | * 11/1998 | Zhang et al. | ............... 438/154 |
| 5,869,803 A | * 2/1999 | Noguchi et al. | ....... 219/121.62 |
| 5,923,966 A | 7/1999 | Teramoto et al. | |
| 6,071,765 A | 6/2000 | Noguchi et al. | |
| 6,482,687 B1 | 11/2002 | Teramoto et al. | |
| 6,495,404 B1 | 12/2002 | Teramoto et al. | |
| 6,753,213 B1 | 6/2004 | Teramoto et al. | |

FOREIGN PATENT DOCUMENTS

| | | |
|---|---|---|
| JP | 06-132219 | 5/1994 |
| JP | 07-135318 | 5/1995 |
| JP | 07-235490 | 9/1995 |
| JP | 07-307286 | 11/1995 |
| JP | 09-312260 | 12/1997 |
| JP | 10-270363 | 10/1998 |

OTHER PUBLICATIONS

Wolf, S.; Tauber, R.N..Silicon Processing for the VLSI Era, vol. 1—Process Technology. Lattice Press, 1986. Pp. 63–70.*

* cited by examiner

*Primary Examiner*—Douglas Wille
*Assistant Examiner*—Ginette Peralta
(74) *Attorney, Agent, or Firm*—Eric J. Robinson; Robinson Intellectual Property Law Office, P.C.

(57) ABSTRACT

In a method of manufacturing a semiconductor device, a laser beam capable of irradiating a large area in one shot is irradiated to an amorphous silicon film into which a catalytic element is intentionally introduced to crystallize the amorphous silicon film, thus obtaining a crystalline silicon film.

14 Claims, 12 Drawing Sheets

Laser Beam

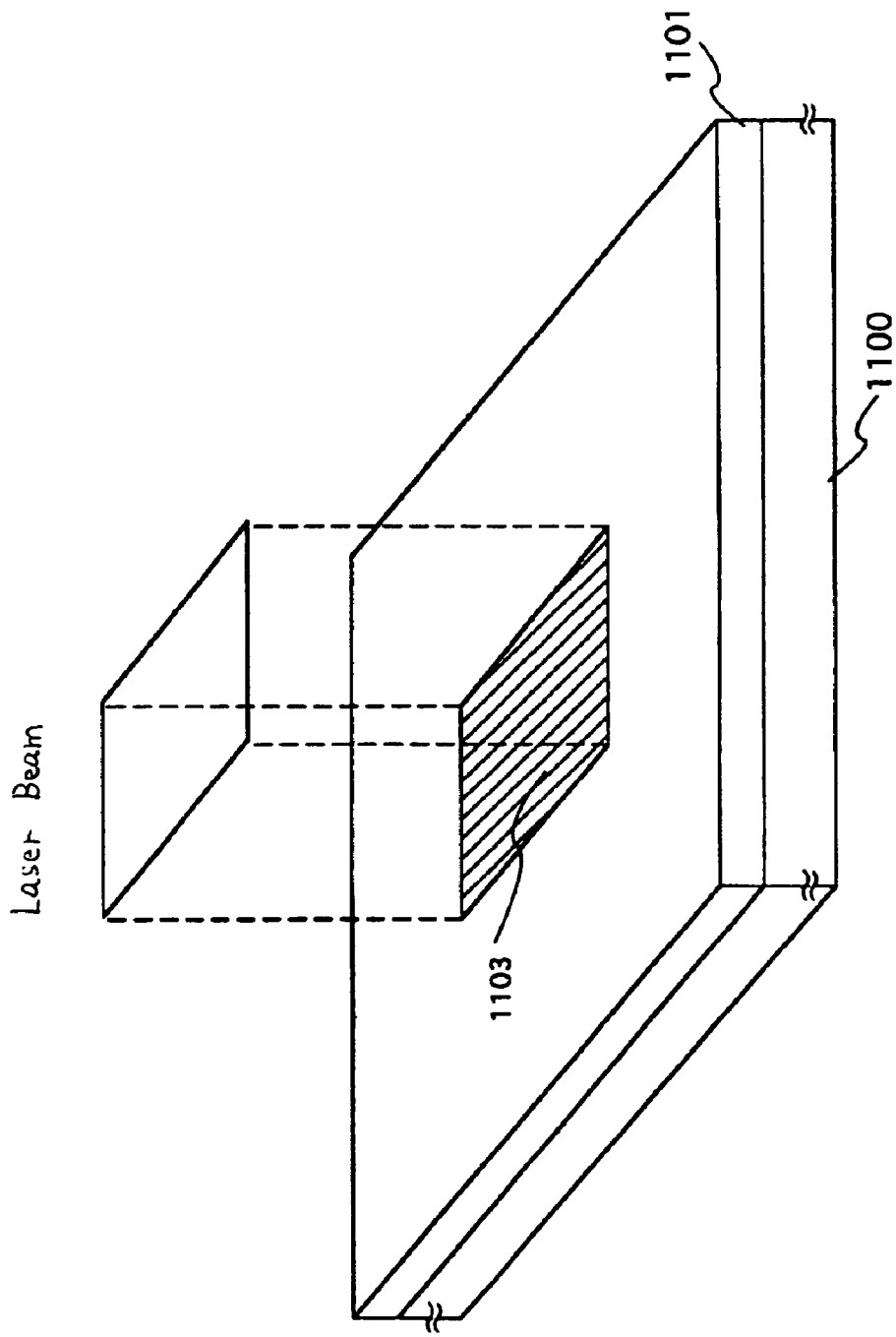

SEMICONDUCTOR DEVICE AND METHOD OF MANUFACTURING THE SAME

BACKGROUND OF THE INVENTION

1. Field of the Invention

The present invention relates to the structure of a semiconductor device in which a thin-film transistor (hereinafter abbreviated as "TFT") is disposed on a substrate having an insulating surface thereof. In this specification, the term semiconductor device designates all the devices that can function using a semiconductor, and all of electro-optical devices, semiconductor circuits and electronic devices are contained in the category of the semiconductor.

2. Description of the Related Art

In recent years, a technique by which a TFT is formed on a substrate having an insulating surface to constitute an electric circuit has been rapidly developed. In the present state, there are many cases in which the TFT is used as a switching element of the liquid-crystal display device (liquid-crystal panel). The active layer which is the most important portion of the TFT is formed of a semiconductor thin film. Up to now, an amorphous silicon film has been mostly employed as the semiconductor thin film. However, a demand for a TFT higher in operation speed has been increased as a result of which a crystalline silicon film (polysilicon film) has been main stream.

As a method of manufacturing a conventional crystalline silicon film, there has been known a solid-phase growing method (thermal annealing method) or a laser annealing method.

The solid-phase growing method, requiring a temperature as high as 600° C. or more, needs to use a quartz substrate high in heat resistance and expensive, and it has been difficult to use an inexpensive glass substrate. Also, the solid-phase growing method is liable to cause irregularity in crystallization, thereby making it difficult to obtain required crystallinity over a wide area.

On the other hand, the laser annealing method is suitable for reducing the costs of the integrated circuit of the TFT because crystallization can be conducted at a process temperature of 550° C. or less without giving a thermal damage to the substrate so that an inexpensive glass substrate can be used. Also, the conventional laser annealing method is difficult to obtain an excellent annealing effect over a large area although high crystallinity can be partially obtained because an area to which a laser beam is applied is small. In particular, the application of a laser beam under the condition where the excellent crystallinity is obtained is liable to be unstable.

As means for solving the above problem, there is a method of promoting crystallization by using a predetermined catalytic element according to the invention made by the present inventors.

This method is a method in which the catalytic element represented by nickel is introduced into an amorphous silicon film, and thereafter a heat treatment is conducted to obtain a crystalline silicone film. In this method, an excellent annealing effect can be obtained over a large area by conducting the heat treatment at a temperature of about 600° C. or less at which the glass substrate can be employed.

Although this method is shorter in processing period than the above-mentioned solid-phase growing method, it still requires the processing period of several hours. For that reason, this method is inferior in mass production to the above-mentioned laser annealing method which is extremely short in processing period.

SUMMARY OF THE INVENTION

The present invention has been made to solve the above problems with the conventional art, and therefore an object of the present invention is to provide a novel and remarkably useful method of manufacturing a crystalline silicon film having high crystallinity over a wide area by crystallizing the amorphous silicon film in a short period.

Also, another object of the present invention is to provide a semiconductor device having a high characteristic using a crystalline silicon film obtained in accordance with the present invention and a method of manufacturing the semiconductor device.

According to a first aspect of the present invention disclosed in this specification, there is provided a method of manufacturing a semiconductor device, characterized by comprising:

a first step of forming an amorphous silicon film;
 a second step of holding a catalytic element that promote the crystallization of silicon in contact with the amorphous silicon film; and
 a third step of irradiating a laser beam to the amorphous silicon film to crystallize the amorphous silicon film.

According to a second aspect of the present invention disclosed in this specification, there is provided a method of manufacturing a semiconductor device, characterized by comprising:

a first step of forming an amorphous silicon film;
 a second step of holding a catalytic element that promote the crystallization of silicon in contact with the amorphous silicon film; and
 a third step of irradiating a laser beam shaped in a rectangle or a square while moving the laser beam from one side of the amorphous silicon film toward another side thereof to sequentially crystallize the amorphous silicon film to form a crystalline silicon film.

According to a third aspect of the present invention disclosed in this specification, there is provided a method of manufacturing a semiconductor device, characterized by comprising:

a first step of forming an amorphous silicon film on a substrate having an insulating surface;
 a second step of holding a catalytic element that promote the crystallization of silicon in contact with the amorphous silicon film; and
 a third step of irradiating a laser beam shaped in a rectangle or a square from one side of said amorphous silicon film toward another side thereof while moving the substrate to sequentially crystallize the amorphous silicon film to form a crystalline silicon film.

According to a fourth aspect of the present invention disclosed in this specification, there is provided a method of manufacturing a semiconductor device, characterized by comprising:

a first step of forming an amorphous silicon film;
 a second step of holding a catalytic element contained in a solution which promote the crystallization of silicon in contact with the amorphous silicon film; and
 a third step of irradiating a laser beam whose irradiation area in one shot is 10 cm$^2$ or more to the amorphous silicon film to crystallize said amorphous silicon film and to form a crystalline silicon film.

According to a fifth aspect of the present invention disclosed in this specification, there is provided a method of manufacturing a semiconductor device, characterized by comprising:

a first step of forming an amorphous silicon film;

a second step of holding a compound containing a catalytic element which promote the crystallization of silicon in contact with the amorphous silicon film; and a third step of irradiating a laser beam whose irradiation area in one shot is 10 cm$^2$ or more to the amorphous silicon film to crystallize the amorphous silicon film and to form a crystalline silicon film.

According to a sixth aspect of the present invention disclosed in this specification, there is provided a method of manufacturing a semiconductor device, characterized by comprising:

a first step of forming an amorphous silicon film;

a second step of holding a catalytic element which promote the crystallization of silicon in contact with the amorphous silicon film;

a third step of irradiating a laser beam whose irradiation area in one shot is 10 cm$^2$ or more to said amorphous silicon film to crystallize said amorphous silicon film and to form a crystalline silicon film; and a fourth step of conducting thermal oxide processing in an oxide atmosphere to form an oxide film on the surface of the crystalline silicon film and gettering the catalytic element to the oxide film to remove or reduce said catalytic element existing in the crystalline silicon film.

In the above 6th aspect, the method is characterized by comprising a fifth step of removing the oxide film after the fourth step.

According to a seventh aspect of the present invention disclosed in this specification, there is provided a method of manufacturing a semiconductor device, characterized by comprising:

a first step of forming an amorphous silicon film;

a second step of holding a catalytic element which promote the crystallization of silicon in contact with the amorphous silicon film;

a third step of irradiating a laser beam whose irradiation area in one shot is 10 cm$^2$ or more to the amorphous silicon film to crystallize the amorphous silicon film and to form a crystalline silicon film; and a fourth step of selectively adding phosphorus or boron to the crystalline silicon film and gettering the catalytic element to the added region by conducting a heat treatment to remove or reduce the catalytic element existing in the crystalline silicon film.

In any one of the above respective aspects, the pulse width of the laser beam irradiated in the third step is 600 nsec to 1 msec.

In any one of the above respective aspects, the laser energy density of the laser beam irradiated in the third step is 100 to 800 mJ/cm$^2$.

In any one of the above respective aspects, the method is characterized in that the catalytic element is at least one element selected from a group consisting of Fe, Co, Ni, Ru, Rh, Pd, Os, Ir, Pt, Cu, Au, Ge, Pb and In.

In any one of the above respective aspects, an amorphous film containing silicon as its main ingredients is used instead of the above amorphous silicon film.

In any one of the above respective aspects, crystal in the crystalline silicon film resulting from crystallizing the amorphous silicon film is crystal whose crystal lattices are continuously coupled with each other.

According to an eighth aspect of the present invention disclosed in this specification, there is provided a semiconductor device including an active region which uses a crystalline silicon film and is disposed on an insulating surface, characterized in that the active region is formed by holding a catalytic element in a solution which promote the crystallization of silicon in contact with an amorphous silicon film and irradiating a laser beam or intense light thereto.

According to a ninth aspect of the present invention disclosed in this specification, there is provided a semiconductor device including an active region which uses a crystalline silicon film and is disposed on an insulating surface, characterized in that the active region is formed by holding a compound containing a catalytic element which promote the crystallization of silicon in contact with an amorphous silicon film and irradiating a laser beam or intense light thereto.

According to a tenth aspect of the present invention disclosed in this specification, there is provided a semiconductor device including an active region which uses a crystalline silicon film and is disposed on an insulating surface, characterized in that the active region is formed by selectively holding a catalytic element in a solution which promote the crystallization of silicon in contact with an amorphous silicon film and irradiating a laser beam or intense light thereto to allow crystal growth from the region where the catalytic element is held toward a periphery of the region.

According to an eleventh aspect of the present invention disclosed in this specification, there is provided a semiconductor device including an active region which uses a crystalline silicon film and is disposed on an insulating surface, characterized in that the active region is formed by selectively holding a compound containing a catalytic element which promote the crystallization of silicon in contact with an amorphous silicon film and irradiating a laser beam or intense light thereto to allow crystal growth from the region where the catalytic element is held toward a periphery of the region.

In any one of the eighth to eleventh aspects, the catalytic element is at least one element selected from a group consisting of Fe, Co, Ni, Ru, Rh, Pd, Os, Ir, Pt, Cu, Au, Ge, Pb and In.

In any one of the eighth to eleventh aspects, crystal in at least a partial region of the crystalline silicon film is crystal whose crystal lattices are continuously coupled with each other.

BRIEF DESCRIPTION OF THE DRAWINGS

These and other objects, features and advantages of this invention will become more fully apparent from the following detailed description when taken in conjunction with the accompanying drawings in which:

FIG. 13 is a schematic diagram showing the entire device in crystallizing step, crystallized through laser beam irradiation according to the present invention.

DETAILED DESCRIPTION OF THE PREFERRED EMBODIMENTS

Now, a description will be given in more detail of preferred embodiments of the present invention with reference to the accompanying drawings.

A method of forming a crystalline silicon film according to an embodiment of the present invention will be described with reference to process diagrams shown in FIGS. 1A to 1C.

Figure 1A:
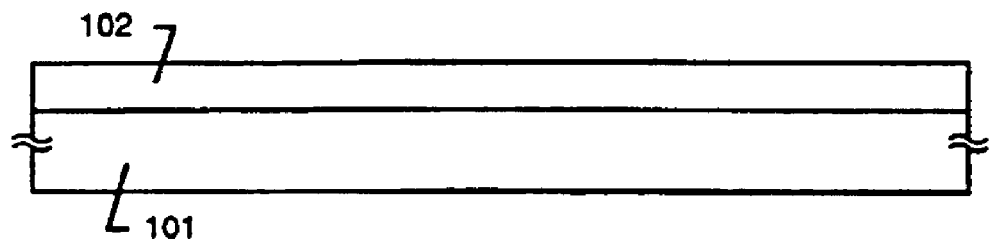
FIGS. 1A to 1C are diagrams showing steps according to one embodiment of the present invention (embodiment 1)

First, an amorphous silicon film 102 is formed on a substrate 101 having an insulating surface thereof (FIG. 1A).

The above substrate 101 is not particularly limited and may be formed of, for example, a glass substrate, a quartz substrate, a ceramic substrate, a semiconductor substrate or the like. Also, in order to improve the flatness, under films may be formed on those substrates. The under film may be formed of a silicon oxide film, a silicon nitride film or a silicon nitride oxide film. In the present specification, the substrate means a substrate including the under layer. If impurities or unevenness portions exist on the substrate or the under layer on which the amorphous silicon film is disposed, random crystal nuclei are liable to be formed. Therefore, it is desirable to conduct impurity removable or flattening processing on the substrate or the underlayer.

The thickness of the above amorphous silicon film can be selected within a range of from about 10 to 100 nm (representatively 10 to 75 nm, preferably 15 to 50 nm). Also, the amorphous silicon film may be replaced by a semiconductor film represented by $Si_xGe_{1-x}$ (0<X<1). In this way, the semiconductor film mainly made of silicon is basically employed. The formation of the above amorphous silicon film 102 may be conducted by a plasma CVD method, low pressure CVD method or other appropriate manners.

Subsequently, a catalytic element that promote the crystallization of silicon is introduced onto the surface of the above amorphous silicon film 102. In FIG. 1B, a film or an aqueous solution layer which is formed in order to introduce the catalytic element onto the amorphous silicon film 102 is shown as a catalytic element contained layer 103 (FIG. 1B).

The above catalytic element that promote the crystallization of silicon may be one or plural kinds selected from Fe, Co, Ni, Ru, Rh, Pd, Os, Ir, Pt, Cu, Au, Ge, Pb and In. Out of the above-mentioned catalytic element, Ni which exhibits immersion dispersion when it is dispersed into the amorphous silicon film can obtain a greatly excellent crystallinity because a dispersion speed is very high. Incidentally, although Ge exhibits substitute dispersion when it is dispersed into the amorphous silicon film, it can be applied to the present invention.

Also, a portion into which the above-mentioned catalytic element is introduced is not particularly limited but the catalytic element is selectively introduced into the entire film surface of the amorphous silicon film or slit faces at appropriate portions on the surface of the amorphous silicon film. Also, the catalytic element can be introduced into the back surface of the amorphous silicon film, and further can be introduced into both of front and back surfaces of the amorphous silicon film.

Also, the method of introducing the catalytic element into the amorphous silicon film is not particularly limited if it is a method of holding the catalytic element in contact with the surface of the amorphous silicon film or a method of holding the catalytic element within the amorphous silicon film. For example, there can be applied a sputtering method, a CVD method, a plasma processing method, an adsorbing method, an ion implanting method or a method of coating a solution containing a catalytic element therein. The method using the solution out of the above methods is simple and useful in that the concentration of catalytic element is easily adjusted.

Metallic salt may be selected from various salts, and solvent, other than water, may be selected from alcohols, aldehydes, ethers or other organic solvents or mixture solvents of water and organic solvents. The solution is not limited to a solution in which the metallic salt is completely dissolved but may be a solution in which a part or all of metallic salt exists in a suspended state.

The sort of metallic salt to be used may be any one of organic salts or inorganic salts if it is a salt capable of forming a solvent or a suspended liquid as described above. For example, iron salt to be used may be iron (I) bromide, iron (II) bromide, iron (II) acetate, iron (I) chloride, iron (II) chloride, iron (II) chloride fluoride, iron (II) nitrate, iron (I) phosphate, iron (II) phosphate or the like. Cobalt salt to be used may be cobalt acetate, cobalt nitrate, cobalt chloride, cobalt fluoride, cobalt nitrate or the like.

Also, nickel salt to be used may be nickel bromide, nickel acetate, nickel oxalate, nickel carbonate, nickel chloride, nickel iodide, nickel nitrate, nickel sulfate, nickel formate, nickel oxide, nickel hydroxide, nickel acetyl acetate, nickel 4-cyclohexyl butyric acid, nickel 2-ethyl hexanoic acid or the like. Also, ruthenium salt to be used may be ruthenium chloride or the like, rhodium salt to be used may be rhodium chloride or the like, palladium salt to be used may be palladium chloride or the like, osmium salt to be used may be osmium chloride or the like, iridium salt to be used may be iridium trichloride, iridium tetrachloride or the like, platinum salt to be used may be platinic chloride or the like, copper salt to be used may be cupric acetate, cupric chloride, cupric nitrate or the like, and gold salt may be gold trichloride, gold chloride or the like.

Also, it is useful to add a surfactant to a solution containing the catalytic element therein. This is because adhesion on a surface to be coated is enhanced to control the adsorptivity. The surfactant may be coated on the surface in advance.

Also, in the case where wettability between the solution containing the catalytic element and the coated surface is low, and the surface repels the solution, it is effective that thermal oxidization, the irradiation of UV light or processing using hydrogen peroxide is conducted to form a thin oxide film of 1 to 5 nm or less on the surface of the amorphous silicon film, thereby improving the wettability.

Also, the added amount of a catalytic element is appropriately selected taking into account the thickness of the amorphous film, a catalytic element introducing method employed, the kind of catalytic element, conditions of the irradiated laser beam (energy density, pulse width, etc.) and so on. For example, in the case where the coating method is used, and nickel is used as the catalytic element, a solution containing nickel of 5 to 10000 ppm, preferably 100 to 10000 ppm (weight conversion) may be coated. The concentration of nickel in the amorphous silicon film thus obtained becomes $1\times10^{17}$ to $1\times10^{21}$ atoms/cm$^3$.

Figure 1B:
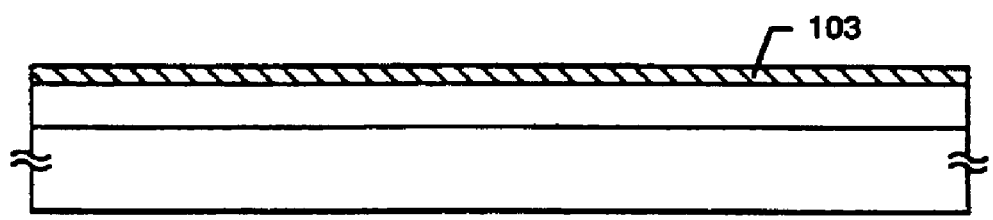
Figure 1C:
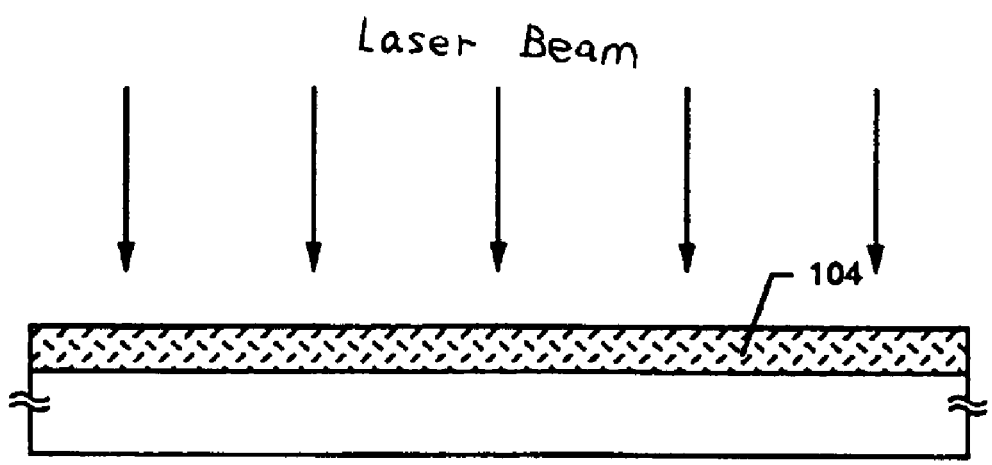

After the catalytic element has been introduced into the amorphous silicon film in the above manner, crystallization is conducted by irradiation of a laser beam to form a crystalline silicon film (FIG. 1C).

A laser to be used is preferably an ultraviolet ray laser such as various excimer lasers, an Nd:YAG laser, an Nd: glass laser, an infrared laser such as ruby laser or visible beam laser. Any of the above lasers is preferably a pulse laser. In particular, various excimer laser beams that are the ultraviolet ray pulse laser are well absorbed by amorphous silicon and advantageous in mass production.

In particular, in the present invention, it is preferable that, as shown in FIG. 13, a laser beam is formed in rectangle or square by using a laser irradiation apparatus having a large output energy which is capable of applying a laser to a large area, and a uniform laser crystallizing process is conducted on a region of several cm$^2$ to several hundreds cm$^2$ in the amorphous silicon film by one irradiation (one shot) of the laser beam. Also, the total energy of the laser irradiating apparatus used for applying the laser beam is 5 joule or more.

In the present invention, the laser beam which is 100 to 800 mJ/cm$^2$ in laser energy density, and 200 nsec or more in pulse width, preferably, 600 nsec to 1 msec is irradiated to the amorphous silicon film in which the catalytic element is held, to thereby form the crystalline silicon film.

Incidentally, in order to crystallize the amorphous silicon film by using the laser beam, it is effective to set the pulse width to the above-mentioned range because a duration at the crystallization optimizing temperature range is required to some degree. In general, it is difficult to increase or decrease the pulse width because it is inherent in the laser. However, according to the present invention, in order to solve this problem, a plurality of laser irradiation apparatuses described above is coupled to each other, and the synchronization of the respective laser irradiation apparatuses are shifted to produce a state in which a plurality of pulses is mixed together, thereby setting the pulse width substantially to 200 nsec or more, preferably 600 nsec to 1 msec.

Also, the substrate or an area to which the laser beam is irradiated is moved in one direction to scan with the above laser beam (shown in FIG. 13) at a given speed, thereby allowing the catalytic element to be dispersed in the film while allowing the crystal to grow continuously in one direction. With this operation, while a portion melted and crystallized by irradiation of the laser beam is being moved, the occurrence of crystal nuclei at random is restrained to obtain a crystalline silicon film in a short period. Incidentally, it is possible that a speed at which the substrate is moved (that is, the scanning speed of the laser beam) is appropriately adjusted so that crystal growth is continuously conducted in connection with the crystallizing speed of the amorphous silicon to form a crystal having a relatively large particle size.

Also, there may be used a method in which the area to which the laser beam is irradiated is moved bit by bit to conduct overlapping scanning so as to apply the laser beam to the entire surface of the amorphous silicon film. In this method, there are locations where an area which has been crystallized once is irradiated with a laser beam again so as to be recrystallized.

Also, there may be used a method in which a temperature distribution is formed by using a phase shift mask or the like in the area to which the laser beam is irradiated while keeping a heat balanced state, and crystal growth is continuously conducted to form a crystal large in particle size.

Also, in order to improve the absorption of the laser beam, a reflection preventing film or a light absorption film may be disposed on a front surface or a back surface of the amorphous silicon film.

Instead of the above laser beam, intense light as strong as laser may be used as in so-called RTA (Rapid Thermal Annealing, or RTP (Rapid Thermal Process)) where a flash lamp heats the sample rising the temperature in a short time up to 1000 to 1200° C. (a temperature of a monitor provided on a silicon wafer). Also, there may be used a process in which intense light as in the RTA is irradiated to form a crystal nucleus, and thereafter the laser beam is irradiated to conduct crystal growth.

Further, in irradiation of the laser beam, the uniformity of crystallization depends on the concentration of hydrogen in the amorphous silicon film. Accordingly, it is preferable that a heating process for reducing the concentration of hydrogen in the amorphous silicon film is added between the amorphous silicon film forming process and the laser beam irradiating process. Also, it is preferable that the conditions under which the amorphous silicon film is formed is appropriately altered to obtain the amorphous silicon film low in the concentration of hydrogen and uniform in the concentration of hydrogen in the film. The same is applied to other impurity elements (oxygen, carbon, nitrogen and so on), and it is preferable to reduce the concentration of impurities.

With the above means, the catalytic element is introduced into the amorphous silicon film, and the laser beam is irradiated to the film, so that a uniform crystalline silicon film 104 can be obtained in a short period of time.

The crystal formation of the crystalline silicon film formed according to the present invention will be described hereinafter.

In the crystal formation of the crystalline silicon film formed in the conventional solid-phase growing method, there has been known that nuclei are produced from a substrate interface or the like at random, and also crystal growth is made at random from the nuclei until gaining some thickness thereof and, further, that columnar crystals whose [100] direction is arranged in a direction perpendicular to the substrate grow generally in the thicker thin film.

Contrary to the conventional solid-phase growing method, in the crystalline silicon film formed according to the present invention, when irradiating the laser beam, the catalytic element is dispersed, the catalytic element or the compound of silicon and the catalytic element held in contact with the amorphous silicon film becomes a crystal nucleus, and crystal growth is conducted in a uniform direction. Also, crystal in the crystalline silicon film according to the present invention is found to have a structure where crystal lattices are continuously coupled with each other.

That is, according to the present invention, the laser beam is irradiated to the amorphous silicon film that holds the catalytic element therein, whereby not only crystallization can be made in a short period of time but also the crystalline silicon film according to the present invention can uniformly obtain the high crystallinity having the continuity of the crystal lattices over a large area as compared with the prior art.

Incidentally, the catalytic element held in contact with the crystalline silicon film obtained according to the above method play the useful role in crystallization, but it is desirable that after the crystalline silicon film is formed, the catalytic element is removed or reduced by using the technique disclosed in Japanese Patent Application Laid-open No. 9-312260 or Japanese Patent Application Laid-open No. 10-270363 by the present inventors because there is the possibility that the existence of the catalytic element leads to many problems. The Japanese Patent Applications Laid-open No. 9-312260 and No. 10-270363 are correspond to pending U.S. Pat. applications Ser. No. 08/785489 and U.S patent application Ser. No. 09/050,182, respectively. An entire disclosure of the Japanese Patent Applications Laid-open No. 9-312260 and No. 10-270363 is incorporated herein by reference.

Hereinafter, a description will be given in more detail of preferred embodiments of the present invention with reference to the accompanying drawings. However, the present invention is not limited to or by those embodiments.

(Embodiment 1)

FIGS. 1A to 1C are diagrams showing a process of manufacturing a crystalline silicon film in accordance with an embodiment of the present invention.

First, an underlying film (not shown) is formed on a substrate 101 having an insulating surface. In this embodiment, a glass substrate is used. The underlying film may be formed of a silicon oxide film, a silicon nitride film or a silicon nitride oxide film which is 100 to 300 nm in thickness. In this embodiment, TEOS is used as a raw material, and a silicon oxide film is formed in thickness of 200 nm. If sufficient flatness is given, the underlying film may not particularly be provided.

Then, an amorphous silicon film 102 which is 20 to 100 nm in thickness is formed on the substrate (FIG. 1A). In this embodiment, the amorphous silicon film 102 is formed in thickness of 50 nm through a low pressure CVD method. The reduced pressure CVD method may be replaced by the plasma CVD method or the like.

The reason that the low pressure CVD method is used in this embodiment is because the quality of the crystalline silicon film which will be obtained later is more excellent, specifically, fine. In this example, it is desirable that the amorphous silicon film is $2 \times 10^{19}$ atoms/cm$^3$ or less in the concentration of oxygen. This is because in the case where the concentration of oxygen is higher than the above range, the crystallization of the amorphous silicon film is impeded. Also, it is desirable that the concentration of nitrogen or the concentration of carbon which is impurities is $2 \times 10^{19}$ atoms/cm$^3$ or less. Similarly, since the crystallization of the amorphous silicon film is impeded when the concentration of hydrogen is high, it is preferable that the amorphous silicon film 102 is formed under the film forming condition where the concentration of hydrogen is reduced as much as possible.

Thereafter, nickel element is introduced as a catalytic element for promoting the crystallization of the amorphous silicon film 102 (FIG. 1B). In this example, the nickel element is introduced by coating with nickel acetate solution containing nickel of 100 ppm (weight conversion) the surface of the amorphous silicon film. In FIG. 1B, nickel acetate solution is shown as a catalytic element contained layer 103. In this situation, it is desirable that fluoric acid treatment or the like is conducted in order to remove the stain and a natural oxide film before introducing the catalytic element.

As a method of introducing the nickel element, there may be used a sputtering method, a CVD method, a plasma processing method, an adsorbing method or the like other than a method using a solution of nickel salt as described above. The method using the solution out of the above methods is useful in that it is the simplest and easy in adjustment of the concentration of the catalytic element. A nickel salt may be various nickel salts; and a solvent of the nickel salt may be water, alcohols, organic solvents other than the alcohols or a mixture solvent of water and an organic solvent.

In this embodiment, an aqueous solution layer is formed by coating nickel acetate solution. In this state, a surplus solvent is blown off by using a spin coater not shown. In this way, the nickel element is held in contact with the surface of the amorphous silicon film.

Incidentally, for example, in the case where acetate solution is coated directly on the surface of the amorphous silicon film, since amorphous silicon repels acetate solution, nickel cannot be uniformly introduced to the entire surface of the amorphous silicon film. Accordingly, it is desirable that before the above coating process is conducted, thermal oxidization, the irradiation of UV light or processing using hydrogen peroxide is conducted to form a thin oxide film of 1 to 5 nm or less on the surface of the amorphous silicon film, to thereby improve the wettability. Also, the natural oxide film may be used as it is.

Then, a laser irradiation is conducted in order to crystallize the amorphous silicon film and to obtain a crystalline silicon film (FIG. 1C). In this embodiment, a laser beam is irradiated to an area of several cm$^2$ to several hundreds cm$^2$, preferably 10 cm$^2$ or more by one application (one shot) of the laser beam by using a laser irradiation apparatus (SAELC manufactured by Sopra Corp.) having a large output energy (15 joule in total energy) which is capable of irradiating a laser to a large area.

The laser beam used in this embodiment is an XeCl excimer laser (308 nm in wavelength) but may be other lasers. The conditions for irradiating the laser beam are that pulse width is 200 nsec or more, preferably, 600 nsec to 1 msec, and the laser energy density is 100 to 800 mJ/cm$^2$ and in this embodiment, 300 mJ/cm$^2$. The laser beam is irradiated to an area as large as about 6 cm×6 cm in one shot.

FIG. 13 is a schematic diagram showing a whole laser irradiating process in accordance with this embodiment. In FIG. 13, reference numeral 1100 denotes a substrate; 1101 is an amorphous silicon film in which a catalytic element is held; and 1103 is a laser irradiated area. Also, it is desirable that the substrate 1100 is moved, and the above laser beam scans at a given speed to allow the catalytic element to be dispersed in the film while allowing the crystal to grow continuously in one direction, thereby crystallizing the amorphous silicon film. Also, the substrate may be heated to about 200 to 450° C. at the time of irradiating the laser beam to further promote the crystallization.

In this way, a crystalline silicon film 104 having excellent crystallinity can be obtained over a large area in a short period of time.

Incidentally, Japanese Patent Application Laid-open No. 7-235490 discloses a technique by which a substrate is heated, and an amorphous silicon film on which a reflection preventing film is disposed is directly annealed by using a laser beam to form a polycrystal silicon thin film. An entire disclosure of the Japanese Patent Application Laid-open No. 7-235490 is incorporated herein by reference. The conditions of the laser beam disclosed in the Japanese Patent Application Laid-open No. 7-235490 can be applied to this embodiment.

In this embodiment, as compared with the Japanese Patent Application Laid-open No. 7-235490, the catalytic element or the compound of silicon and the catalytic element held in contact with the amorphous silicon film form a crystal nucleus, thereby making crystal growth in a uniform direction possible; because the catalytic element is used. Accordingly, the crystallinity is more uniform as compared with that disclosed in the Japanese Patent Application Laid-open No. 7-235490. The crystals in the crystalline silicon film according to this embodiment become crystals in which crystal lattices are continuously coupled with each other.

In this embodiment, with the irradiation of a laser beam to the amorphous silicon film in which the catalytic element is held, not only crystallizing speed is increased and crystallization can be performed in a short period of time, but also the crystalline silicon film according to the present invention can uniformly obtain high crystallinity over a large area as compared with the prior art.

(Embodiment 2)

This embodiment is an example in which crystal growth different from that in the embodiment 1 is conducted. This embodiment relates to a method in which crystal growth in a direction parallel to the substrate, which is called "lateral growth", is conducted by using the catalytic element that promote the crystallization of silicon. FIGS. 2A to 2D are diagrams showing steps of manufacturing a crystalline silicon film in accordance with the embodiment 2. First, a silicon nitride oxide film having a thickness of 300 nm is formed on a Corning 1737 glass substrate 201 as an underlying film (not shown) through the low pressure CVD method. It is needless to say that the above glass substrate may be replaced by a quartz substrate.

Then, an amorphous silicon film 202 that forms a starting film of the crystalline silicon film is formed in thickness of 100 nm through the low pressure CVD method. The low pressure CVD may be replaced by the plasma CVD method or the like. Subsequently, a silicon oxide film not shown is formed in thickness of 150 nm and then patterned to form a mask indicated by numeral 204. This mask has an opening in an area indicated by numeral 203. The amorphous silicon film 202 is exposed in the region where the opening 203 is formed.

The opening 203 has a slender rectangle longitudinally extending from the back of the drawing toward the front thereof. The width of the opening 203 is appropriately set to 20 μm or more, and the length thereof in the longitudinal direction may be arbitrarily decided. In this example, the width is set to 30 μm and the length is set to 5 cm. Then, after nickel acetate solution containing nickel element of 10 ppm in weight conversion is applied, spinning dry is conducted by using a spinner not shown to remove excessive solution. In this way, there is realized a state in that the nickel element is held as a solution in contact with the surface where the amorphous silicon film 202 is exposed as indicated by a dotted line 205 in FIG. 2B.

Although the amount of nickel contained in the solution depends on the sort of solution, as a rough figure, the amount of nickel is desirably set to 5 to 10000 ppm, preferably 100 to 10000 ppm (weight conversion) with respect to the solution. Also, in this situation, the concentration of nickel in the amorphous silicon film exists in a range of from $1\times10^{17}$ to $1\times10^{21}$ atoms/cm$^3$. This is a value determined in view of the concentration of nickel in the film which has been crystallized or the fluoric acid resistance.

Then, laser irradiation is conducted in a nitrogen atmosphere containing hydrogen of 3 volume % but oxygen as little as possible. In this embodiment, an area of several cm$^2$ to several hundreds cm$^2$, preferably 10 cm$^2$ or more is irradiated with laser in one irradiation (one shot), using a system connecting a plurality of laser irradiation apparatuses (VEL, a product of Sopra Corp.) that may irradiate on a large area with laser and have a large output energy.

Though the XeCl excimer laser is used here, other laser may be employed. Conditions for irradiating a laser beam is such that the pulse width is 200 nsec or more, preferably 600 nsec to 1 msec, and energy density of 100 to 500 mJ/cm$^2$. In this embodiment, the density is set to 280 mJ/cm$^2$ and a wide area with a diagonal line of 4 inch is irradiated.

Also, it is desirable that the substrate is moved, and the above laser beam scans at a given speed to allow the catalytic element to continuously conduct crystal growth in one direction. Also, the substrate may be heated to about 200 to 450° C. at the time of irradiating the laser beam to further promote the crystallization.

Figure 2A:
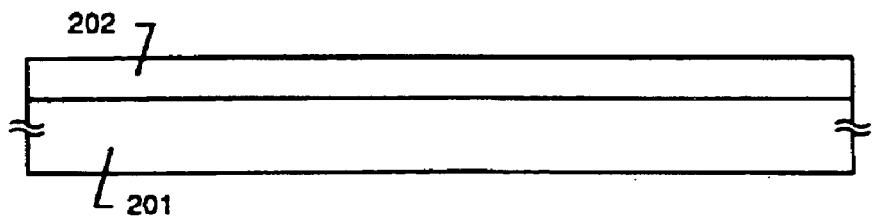
FIGS. 2A to 2D are diagrams showing steps according to another embodiment of the present invention (embodiment 2)
Figure 2B:
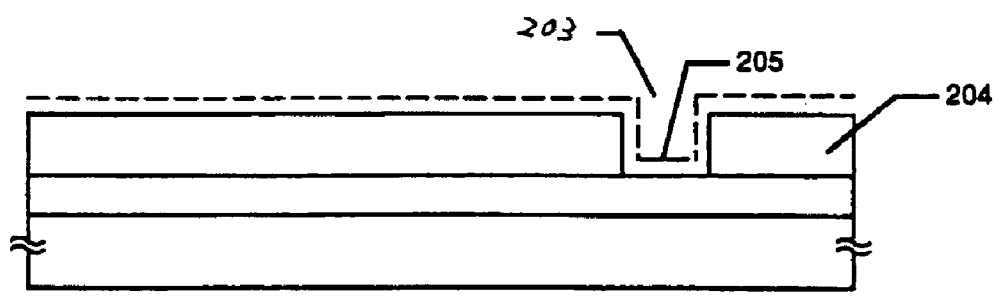
Figure 2C:
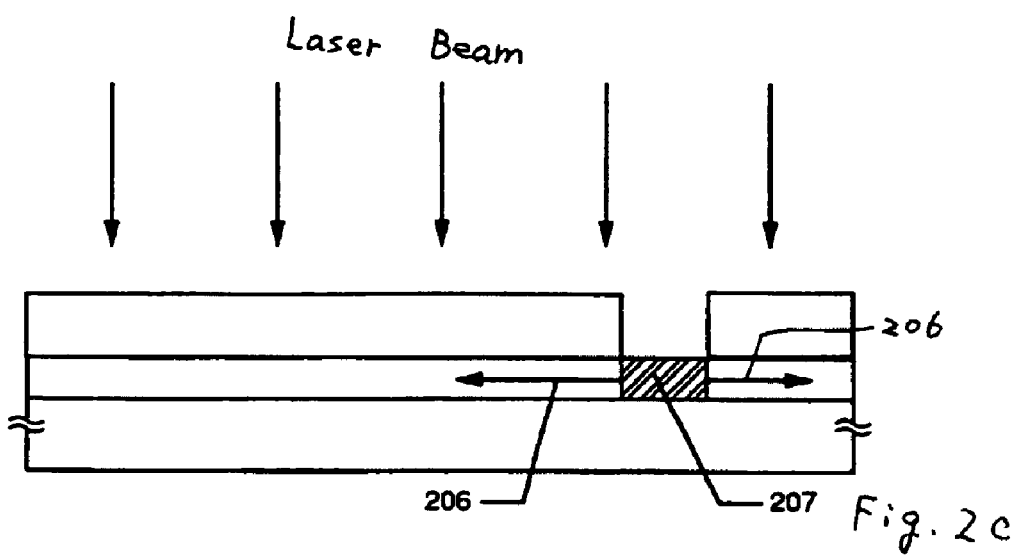

As indicated by arrows 206 in FIG. 2C, crystal growth in a direction parallel to the substrate progresses. The crystal growth progresses from an area of the opening 203 into which nickel element is introduced toward the periphery thereof. The crystal growth in a direction parallel to the substrate is called "lateral growth" in the present specification.

Figure 2D:
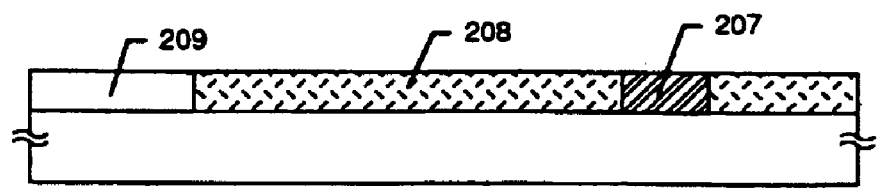

In this way, a crystalline silicon film 208 having the area where the lateral growth is made can be obtained in a short period of time. In an area 207 where the opening 203 is formed, the crystal growth in a longitudinal direction which is called "longitudinal growth" progresses from the surface of the silicon film toward the interface with the underlying film. Subsequently, the mask 204 which is a silicon oxide film for selectively introducing the nickel element is removed. In this way, a state shown in FIG. 2D is obtained. In this state, the longitudinal growth area 207, the lateral growth area 208 and a region 209 where crystal growth does not reach (an area of an amorphous state) exist in the silicon film.

In at least a part of the crystalline silicon film thus obtained, the catalytic element or the compound of silicon and the catalytic element held in contact with the amorphous silicon film form a crystal nucleus, thereby making crystal growth in a uniform direction possible. The crystals in the crystalline silicon films 207 and 208 according to this embodiment is crystals in which crystal lattices are continuously coupled with each other. Also, in the case where the crystalline silicon film obtained according to this embodiment is used as an active layer of a TFT, the areas 207 and 208 can be used, and the area 208 may be preferably used.

(Embodiment 3)

In this embodiment, an example in which a process for dehydrogenating in the amorphous silicon film is conducted immediately before a process for conducting laser irradiation in the process of the embodiment 1 will be described hereinafter. Since the process is half way identical with the process for manufacturing the crystalline silicon film shown in the embodiment 1, only a difference therebetween will be described. Incidentally, this embodiment can be combined with the embodiment 2.

First, the structure of FIG. 1A is obtained by using the same method as that of the manufacturing process in the embodiment 1. Thereafter, a heat treatment is conducted at 400 to 500° C. for 1 to 2 hours to reduce the concentration of hydrogen. The following process is the same as that in the embodiment 1.

In this embodiment, the concentration of hydrogen in the crystalline silicon film can be reduced, and the crystalline silicon film having an excellent crystallinity can be obtained.

(Embodiment 4)

In this embodiment, an example in which a process for dehydrogenating in the amorphous silicon film is conducted immediately before a process for introducing the catalytic element in addition to the process of the embodiment 1 will be described hereinafter. Since the process is half way identical with the process for manufacturing the crystalline silicon film shown in the embodiment 1, only a difference therebetween will be described. Incidentally, this embodiment can be combined with all of the embodiments 1 to 3.

First, the structure of FIG. 1B is obtained by using the same method as that of the manufacturing process in the embodiment 1. Thereafter, a heat treatment is conducted at 450 to 550° C. for 1 to 2 hours to reduce the concentration of hydrogen on which the uniformity of crystallization depends. Since the heat treatment at 500° C. or more may allow the amorphous silicon film to be crystallized, attention must be paid. The following process is the same as that in the embodiment 1.

In this embodiment, the concentration of hydrogen in the crystalline silicon film can be reduced as in the embodiment 3, thus obtaining the crystalline silicon film having an excellent crystallinity.

(Embodiment 5)

This embodiment is an example in which the catalytic element is introduced into the amorphous silicon film in a process different from the process shown in the embodiments 1 to 4. In this embodiment, nickel or nickel compound layer is formed on the amorphous silicon film as the catalytic element. A method is used in which a film made of nickel or nickel compound is formed through the sputtering method. The thickness of nickel or nickel compound layer may be determined according to the amount of nickel as required.

This embodiment can be combined with all of the embodiments 1 to 4.

(Embodiment 6)

This embodiment is an example in which the catalytic element is introduced into the amorphous silicon film in a process different from the process shown in the embodiments 1 to 5. In this embodiment, a method of resolving and depositing gasified organic nickel (gas-phase deposition method) by heat, light or plasma is used. The volume of the organic nickel may be determined according to the amount of nickel as required.

This embodiment can be combined with all of the embodiments 1 to 3.

(Embodiment 7)

This embodiment is an example in which the catalytic element is introduced into the amorphous silicon film in a process different from the process shown in the embodiments 1 to 5. In this embodiment, an emersion-like material where powders made of nickel single substance or nickel compound are uniformly dispersed in a dispersion medium if not nickel is completely dissolved. Alternatively, a solution for forming an oxide film is used. Such a solution may be OCD (Ohka diffusion source) made by Tokyo Ohka Kogyo Inc.. The OCD solution is coated on the formation surface and baked at about 200° C., to thereby simply form the silicon oxide film. If nickel is contained in the silicon oxide film, nickel can be held in contact with the amorphous silicon film.

This embodiment can be combined with all of the embodiments 1 to 4.

(Embodiment 8)

This embodiment is an example in which the laser beam in the embodiments 1 to 7 is replaced by an infrared lamp. In the case where the infrared ray is used, the silicon film can be selectively heated without heating the glass substrate so much. Accordingly, the heat treatment can be effectively conducted without giving a thermal damage to the substrate.

This embodiment can be combined with all of the embodiments 1 to 7.

(Embodiment 9)

Figure 3A:
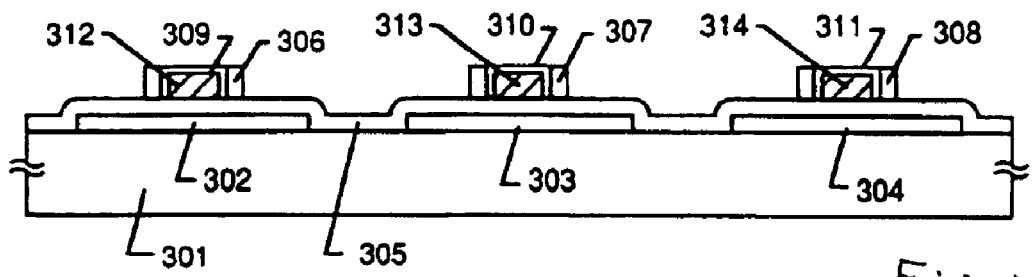
FIGS. 3A to 3D are diagrams showing steps for manufacturing a TFT using a crystalline silicon film according to the present invention (embodiment 9)
Figure 3B:
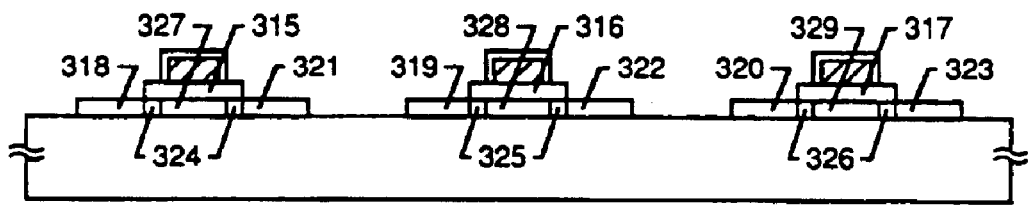
Figure 3C:
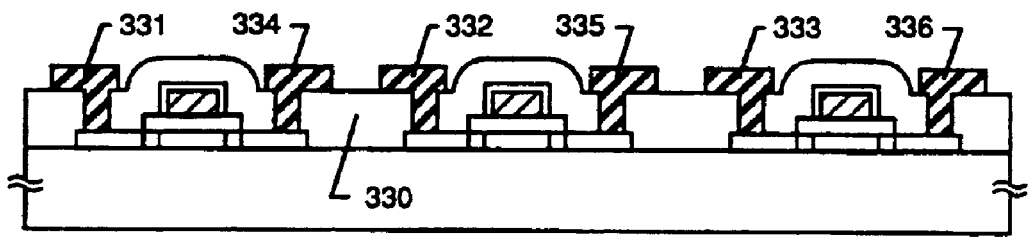
Figure 3D:
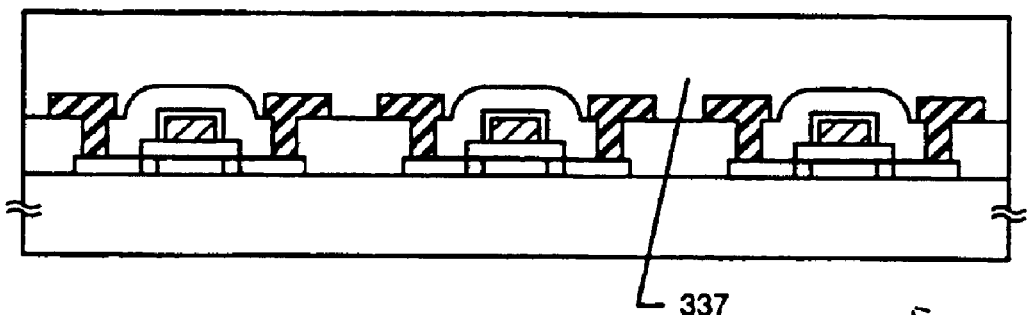
Figure 4A:
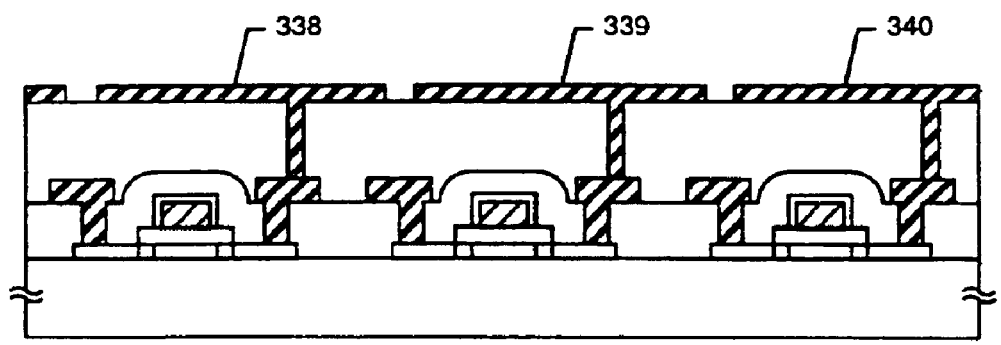
FIGS. 4A and 4B are diagrams showing steps for manufacturing the TFT using the crystalline silicon film according to the present invention (embodiment 9)

According to this embodiment, a process for manufacturing a thin-film transistor (TFT) using the crystalline silicon film obtained in the above respective embodiments 1 to 8 to manufacture a reflection type liquid crystal display device is shown in FIGS. 3 and 4. Because the present invention is a technique relating to the crystalline silicon film used for the active layer, the switching element structure, for example, the structure of the TFT is not limited to this embodiment.

First, the crystalline silicon film is formed on the substrate or the under film in accordance with the above respective embodiments. Then, the crystalline silicon film is patterned in a normal photolithographic process to obtain active layers 302, 303 and 304 having a thickness of 50 nm. Although only three TFTs are described in this embodiment, 1,000,000 or more TFTs are formed in a pixel matrix area in fact.

Then, a silicon oxide film 150 nm in thickness is formed as a gate insulating film 305. The gate insulating film 305 may be a silicon oxide film, a silicon nitride film, a silicon nitride oxide film or a laminate film having a thickness 100 to 300 nm consisting of the silicon oxide film, the silicon nitride and the silicon nitride oxide film. Thereafter, a film (not shown) mainly containing aluminum is formed on the gate insulating film by using a target containing scandium of 0.2 wt% and is patterned to form an island pattern to be the original of a gate electrode. Tantalum is able to be used except for the aluminum.

In this embodiment, a technique disclosed in Japanese Patent Application Laid-open No. 7-135318 is employed. The Japanese Patent Application Laid-open No. 7-135318 corresponds to a U.S.Pat. No. 5,648,277. An entire disclosure of the Japanese Patent Application Laid-open No. 7-135318 is incorporated herein by reference.

First, anodic oxidation is conducted in oxalic acid aqueous solution of 3% while the resist mask used when patterning remains on the island pattern. In this situation, a formation current of 2 to 3 mV flows with a platinum electrode as a cathode to obtain an achievable voltage of 8 V. In this way, porous anodic oxide films 306, 307 and 308 are formed.

Thereafter, anodic oxidation is conducted in a solution where ethylene glycol solution having tartaric acid of 3% is neutralized with ammonia water after the resist mask is removed. In this situation, the formation current is 5 to 6 mV, and the achievable voltage is 100 V. In this way, fine anodic oxide films 309, 310 and 311 are formed.

Then, gate electrodes 312, 313 and 314 are defined by the above process. In a pixel matrix area, gate lines that connect to the respective electrodes every one line are also formed simultaneously with the formation of the gate electrodes (FIG. 3A).

Subsequently, the gate insulating film 305 is etched with the anodic oxide films 305, 306, 307, 308, 309, 310 and 311 and the gate electrodes 312, 313 and 314 as masks. Etching is conducted through the dry etching method using $CHF_3$ gas. As a result, gate insulating films having shapes indicated by numeral 315, 316 and 317 are formed.

Then, the anodic oxide films 306, 307 and 308 are removed by etching, and in this state, impurity ions giving one conductivity are added through an ion implanting method or a plasma doping method. In this case, P (phosphorus) ions may be added thereto if the pixel matrix area is formed of n-type TFTs whereas B (boron) ions may be added thereto if it is formed of p-type TFTs.

Incidentally, the impurity ion adding process is divided into two and conducted. The first adding process is conducted at a high acceleration voltage of about 80 keV, and adjustment is made so that the concentration peak of impurity ions comes under the edge portions (projection portions) of the gate insulating films 315 to 317. Then, the second adding process is conducted at a low acceleration voltage of about 5 keV, and adjustment is made so that the impurity ions are not added under the edge portions (projection portions) of the gate insulating films 315, 316 and 317.

In this way, source regions 318, 319 and 320, drain regions 321, 322 and 323, low-concentration impurity regions (also called LDD regions) 324, 325, 326 and channel formation regions 327, 328 and 329 of the TFT are formed (FIG. 3B).

In this situation, it is preferable that the impurity ions are added to the source and drain regions to the degree where a sheet resistance of 300 to 500 $\Omega$/square is obtained. Also, the low-concentration impurity region is required to be optimized according to the performance of the TFT. Further, after the impurity ion adding process is completed, a heat treatment is conducted to activate the impurity ions.

Then, a silicon oxide film 400 nm in thickness is formed as a first interlayer insulating film 330, and source wirings (including the source electrodes) 331, 332 and 333, drain wirings (including the drain electrodes) 334, 335 and 336 are formed on the silicon oxide film (FIG. 3C). Also, the first interlayer insulating film may be made of silicon nitride oxide or other insulating material other than the silicon oxide film.

Subsequently, an organic resin film 0.5 to 1 $\mu$m in thickness is formed as a second interlayer insulating film 337. The second interlayer insulating film 337 may be formed of a silicon oxide film, a silicon nitride oxide film, an organic resin film or the like. The organic resin film may be made of polyimide, polyamide, polyimide-amide, acrylic resin or the like. In this embodiment, an acrylic film is formed in thickness of 1 $\mu$m (FIG. 3D).

After the second interlayer insulating film 337 is formed, a flattening process such as CMP (chemical mechanical polishing) may be conducted.

Subsequently, patterning is conducted to form a contact hole, an aluminum film to which titanium of 1 wt % is added is formed in thickness of 100 nm, and patterning is conducted to form pixel electrodes 338, 339 and 340. It is needless to say that other metal material may be used.

Then, an insulating layer 341 that covers the pixel electrodes 338, 339 and 340 is formed for protecting the pixel electrodes. If the pixel electrodes are formed such that boundary portions are defined on the source wirings 331, 332 and 333 as in this embodiment, the source wirings 331, 332 and 333 function as black masks.

In the above way, a pixel matrix area is completed. In fact, a driver circuit that drives the pixel TFTs and so on are formed on the same substrate at the same time. The substrate formed thereon the driver circuit and the pixel TFTs is called "TFT-side substrate" or "active matrix substrate". In the present specification, the active matrix substrate is called "first substrate".

Figure 4B:
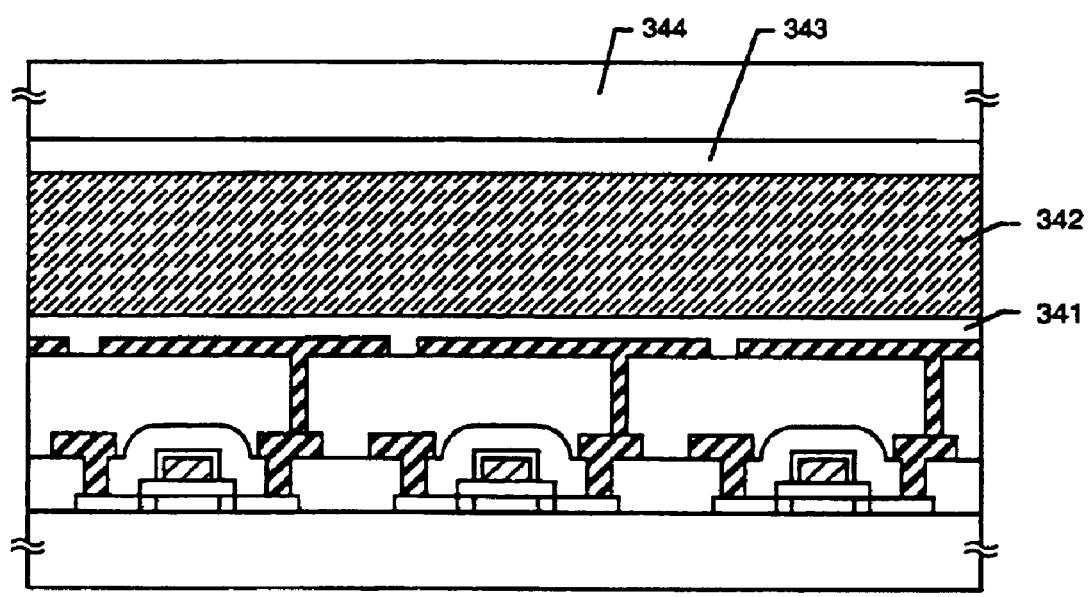

After completion of the first substrate, an opposed substrate (in the present specification, the opposed substrate is called "second substrate") that is a translucent substrate 344 formed thereon an opposed electrode 343 is stuck to the first substrate to hold a liquid crystal layer 342 therebetween. In this way, a reflection type liquid crystal display shown in FIG. 4B is completed.

In this embodiment, the reflection type liquid crystal display is manufactured as one example, but the present invention is not limited to this type. For example, if a process for providing a light shield film or the like that shields the TFT from the light is added or patterning of the pixel electrode is appropriately changed by using a transparent conductive film (indium tin oxide, $SnO_2$, etc.) as the material of the pixel electrodes, a transmission type liquid crystal display can be readily manufactured.

The cell assembling process may be conducted according to a known method. Also, dichroism pigment may be dispersed in the liquid crystal layer, or a color filter may be disposed on the opposed substrate. Since such options as the kind of the liquid crystal layer of this type, the presence/absence of the color filter and so on are changed depending on in which mode the liquid crystal is driven, an implementor may appropriately determine.

(Embodiment 10)

According to this embodiment, an example in which halogen element is used in a process of gettering the catalytic element (that promote the crystallization of silicon) existing in the crystalline silicon film obtained in the above embodiments 1 to 9 is shown in FIGS. 5A to 5E.

Figure 5A:
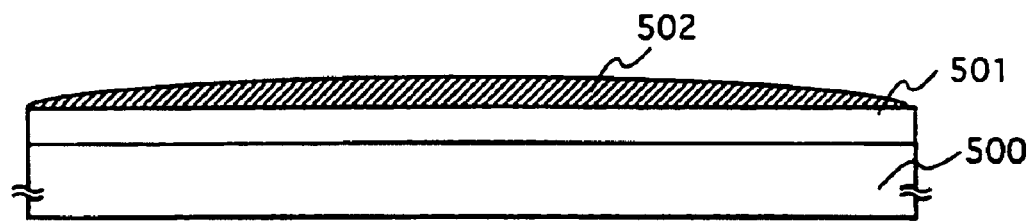
FIGS. 5A to 5E are diagrams showing steps according to still another embodiment of the present invention (embodiment 10)

First, a crystalline silicon film is formed on a substrate through the process shown in the embodiment 1. In this example, an acetate aqueous solution 502 containing nickel is coated on the surface of an amorphous silicon film 501 formed on a quartz substrate 500 (FIG. 5A). In the case where a glass substrate is used, it is necessary that a heating temperature in the following gettering process is set below a strain point of the substrate.

In this state, a surplus solution is blown off by using a spin coater not shown. In this way, the nickel element is held in contact with the surface of the amorphous silicon film. Taking into account the remaining of the impurities in the following process, it is desirable to use a solution containing nickel salt that does not contain carbon, for example, nickel sulfate solution.

Figure 5B:
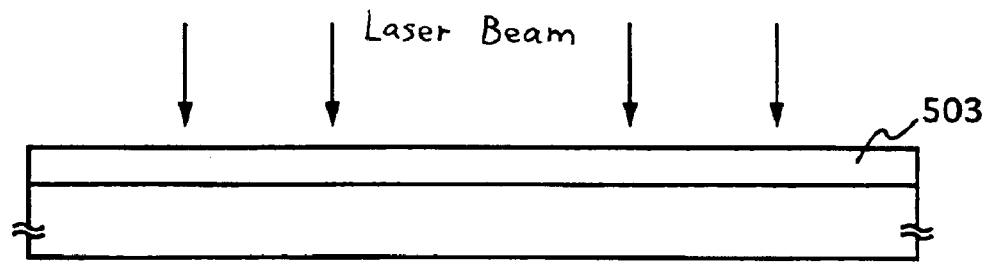
Figure 5C:
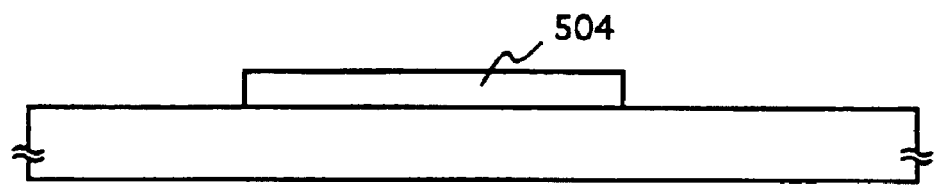

Subsequently, a laser beam is irradiated through the process shown in the embodiment 1 to disperse the catalytic element while the amorphous silicon film is crystallized, to thereby obtain a crystalline silicon film 503 (FIG. 5B). In this embodiment, a laser beam is irradiated to an area of about 7 cm×10 cm in one irradiation (one shot) of the laser beam by using a laser irradiation apparatus (SAELC made by Sopra Corp.) having a large output energy which is capable of irradiating a laser to a large area. The laser beam used in this embodiment is an XeCl excimer laser but may be other lasers. The conditions for irradiating the laser beam are that the laser energy density is 100 to 800 mJ/cm$^2$ and in this embodiment, 300 mJ/cm$^2$.

Thereafter, upon completion of the laser beam irradiating process for crystallization, patterning is conducted to form an insular semiconductor layer 504 (used as an active layer of the TFT) which is formed of an area having excellent crystallinity.

Figure 5D:
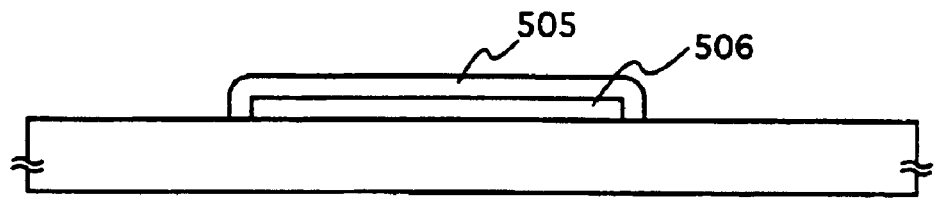

Then an oxide film 505 is formed on the surface of the crystalline silicon film through a heat treatment (FIG. 5D). In this situation, the nickel element remaining in the crystalline silicon film is gettered in the thermal oxide film. The heat treatment employs the gettering effect of the metal element due to the halogen element which is contained in a processing atmosphere. In order to sufficiently obtain the gettering effect due to the halogen element, it is preferable to conduct the above heat treatment at a temperature exceeding 700° C. A temperature of 700° C. or less makes it difficult to resolve the halogen compound in the processing atmosphere, resulting in a fear that the gettering effect is not obtained. For that reason, the heat treatment temperature is preferably set to 800 to 1000° C. (representatively 950° C.), and the processing period of time is set to 0.1 to 6 hours, representatively 0.5 to 1 hour. A representative embodiment is such that a heat treatment is conducted at 950° C. for 30 minutes in the atmosphere where hydrogen chloride (HCl) with the concentration of 0.5 to 10 volume % (3 volume % in this embodiment) is contained in an oxygen atmosphere. Also, other than HCl gas, there may be used one or plural kinds of compound containing halogen elements, selected from a group consisting of HF, $NF_3$, HBr, $Cl_2$, $ClF_3$, $BCl_3$, $F_2$ or $Br_2$. Also, the above gettering processing is effective for other metal elements other than nickel. As metal elements that can be mixed into the silicon film, elements constituting a film deposition chamber (representatively, aluminum, iron, chromium or the like) are first to come. When the above gettering processing is conducted, the concentration of those metal elements can be restrained to $5 \times 10^{17}$ atoms/$cm^3$ or less (preferably $2 \times 10^{17}$ atoms/$cm^3$ or less). The Japanese Patent Application Laid-open No. 9-312260 teaches the above gettering process in detail.

The above gettering process may be conducted without conducting the above patterning process.

Figure 5E:
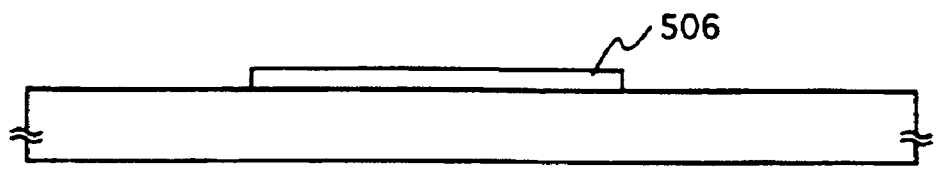

Subsequently, after the above gettering process, the thermal oxide film containing nickel element with a high concentration is removed (FIG. 5E). With this process, a crystalline silicon film high in crystallinity but low in the concentration of nickel element is obtained.

This embodiment can be combined with all of the embodiments 1 to 9.

(Embodiment 11)

The embodiment 10 shows an example in which halogen element is used in the process for gettering the catalytic element that promote the crystallization of silicon. According to this embodiment, an example in which phosphorus element is used in the process for gettering the catalytic element is shown in FIGS. 6A to 6E. Boron element may be used instead of the phosphorus element.

Figure 6A:
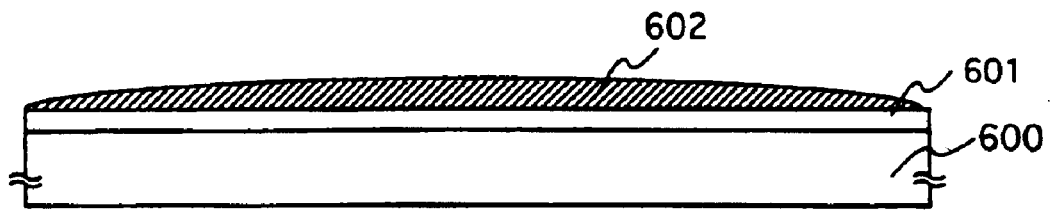
FIGS. 6A to 6E are diagrams showing steps according to yet still another embodiment of the present invention (embodiment 11)

First, a crystalline silicon film is formed on a substrate through the process shown in the embodiment 1. In this example, a nickel sulfate solution 602 containing nickel is coated on the surface of an amorphous silicon film 601 formed on a quartz substrate 600 (FIG. 6A). In the case where a glass substrate is used, it is necessary that a heating temperature in the following gettering process is set below a strain point of the substrate.

In this state, a surplus solution is blown off by using a spin coater not shown. In this way, the nickel element is held in contact with the surface of the amorphous silicon film.

Figure 6B:
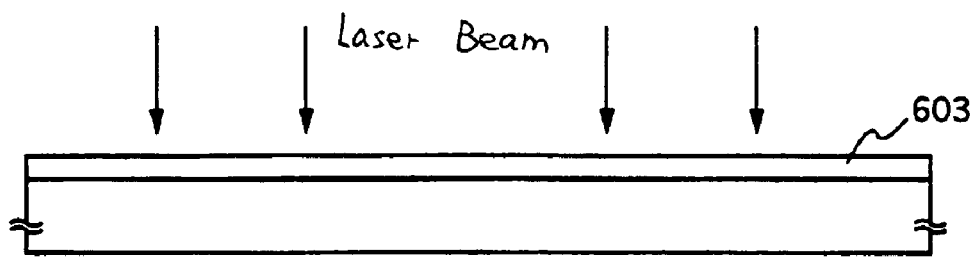

Subsequently, a laser beam is irradiated through the process shown in the embodiment 1 to thereby obtain a crystalline silicon film 603 (FIG. 6B). In this embodiment, a laser beam is applied to an area of about 6 cm×6 cm in one irradiation (one shot) of the laser beam by using a laser irradiation apparatus (VEL made by Sopra Corp.) having a large output energy which is capable of irradiating a laser to a large area. The laser beam used in this embodiment is an XeCl excimer laser but may be other lasers. The conditions for irradiating the laser beam are such that the pulse width is 200 nsec or more, preferably 600 nsec to 1 msec and the laser energy density is 100 to 500 mJ/$cm^2$ and in this embodiment, 280 mJ/$cm^2$. In this embodiment, in order to obtain the pulse width in the above range, a technique disclosed in Japanese Patent Application Laid-open No. 6-132219 is employed. The Japanese Patent Application Laid-open No. 6-132219 corresponds to U.S. Pat. No. 5,533,040. An entire disclosure of the Japanese Patent Application Laid-open No. 6-132219 is incorporated herein by reference.

Figure 6C:
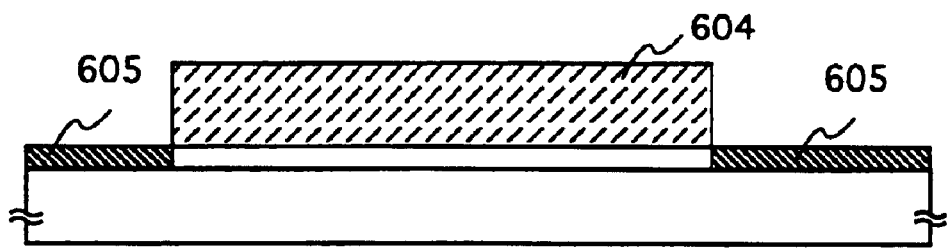

In the case where phosphorus element is used, phosphorus is added to an area 605 except an area which will form an active layer. As the phosphorus adding method, after crystallization is made by the irradiation of a laser beam using the catalytic element, a resist 604 that covers the area which will form the active layer is formed. Then, phosphorus ions are implanted through solution coating of spin coating or through the ion doping method (FIG. 6C). The phosphorus ions are implanted in an area indicated by numeral 605 in FIG. 6C.

Figure 6D:
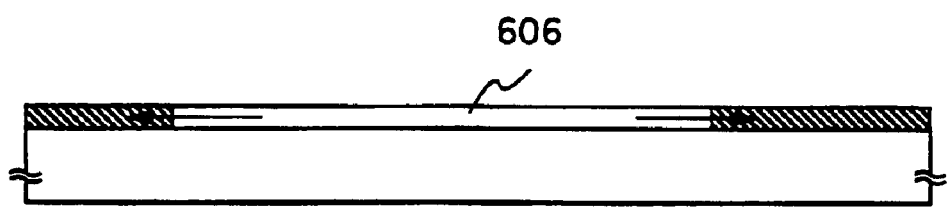

Thereafter, a heat treatment is conducted at a temperature of 400 to 1050° C. (preferably 600 to 750° C.) for 1 minute to 20 hours (representatively 30 minutes to 3 hours) (FIG. 6D). Since this heat treatment permits the catalytic element to be gettered in an area 605 to which phosphorus is added, the concentration of the catalytic element in the area 606 is reduced to $5 \times 10^{17}$ atoms/$cm^3$ or less. For details of the above gettering process, refer to the Japanese Patent Application Laid-open No. 10-270363.

Figure 6E:
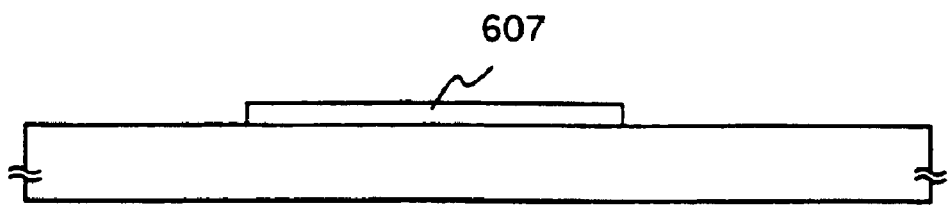

In this way, after completion of the gettering process, an active layer 607 is formed by using the area to which phosphorus is not added (FIG. 6E).

It is needless to say that if a heat treatment (gettering process) is conducted in an atmosphere containing halogen element therein after the process of FIG. 6D, the synergistic effect consisting of the gettering effect by phosphorus element according to this embodiment and the gettering effect by halogen element is obtained.

This embodiment can be combined with all of the embodiments 1 to 10.

(Embodiment 12)

In this embodiment, an example will be described in which a TFT different in structure from the TFT shown in the embodiment 9 is employed as a semiconductor element for conducting the active matrix drive. The TFT having the structure described in this embodiment is easily applicable to the embodiments 1 to 11.

In the embodiment 9, the coplanar TFT which is the representative top gate TFT is described as one example. However, the TFT may be a bottom gate TFT. What is shown in FIG. 7 is an example using an inverse stagger TFT which is a representative example of the bottom gate TFT.

Figure 7:
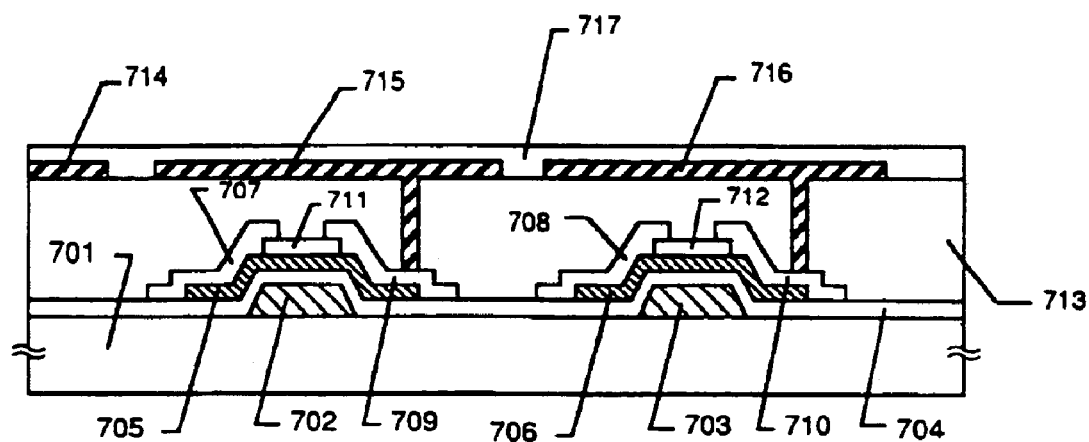
FIG. 7 is a cross-sectional view showing the structure of a bottom type thin-film transistor using a crystalline silicon film according to the present invention (Embodiment 12)

In FIG. 7, numeral 701 denotes a glass substrate, 702 and 703 are gate electrodes, 704 is a gate insulating film, and 705 and 706 are active layers. In this embodiment, the active layers 705 and 706 are formed using the crystalline silicon film produced in the above-mentioned respective embodiments. Each of the active layers 705 and 706 is formed of a silicon film to which impurities are intentionally not added.

Also, numeral 707 and 708 denote source wirings (including the source electrodes), 709 and 710 are drain wirings (including drain electrodes) and 711 and 712 are silicon nitride films which function as channel stoppers (or etching stoppers). That is, regions positioned under the channel stoppers 711 and 712 of the active layers 705 and 706 substantially function as the channel formation regions.

The above structure is of the basic structure of the inverse stagger TFT.

The inverse stagger TFT thus structured is covered with an interlayer insulating film 713 formed of an organic resin film, and pixel electrodes 714, 715 and 716 made of reflective metal material are formed on the interlayer insulating film 713 to form an insulating film 717.

In the above manner, a first substrate having a pixel matrix area is completed.

(Embodiment 13)

This embodiment is an example in which the present invention is applied to a so-called silicon gate TFT using a conductive silicon film as a gate electrode. Since the basic structure is substantially identical with that of the TFT manufactured in the embodiment 9, only a difference therebetween will be noted and described.

Figure 8:
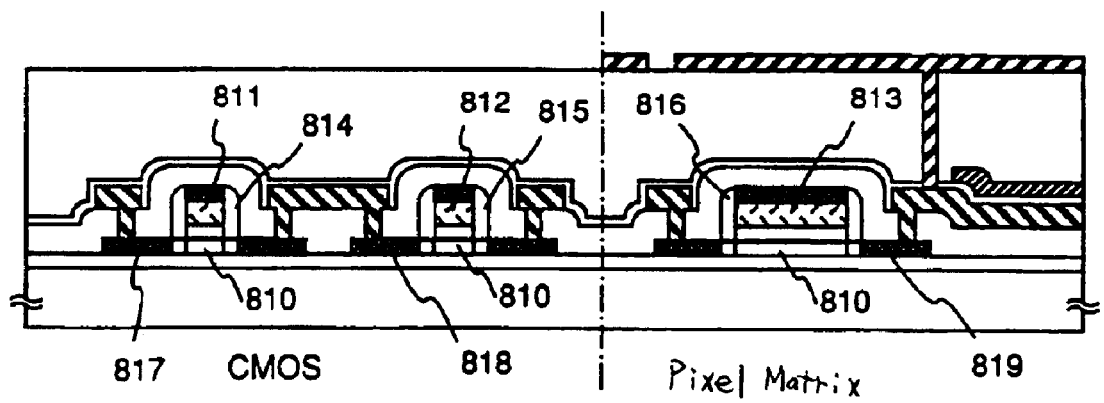
FIG. 8 is a cross-sectional view showing the structure of a silicon gate type thin-film transistor using a crystalline silicon film according to the present invention (Embodiment 13)

In FIG. 8, numeral 810 denotes a channel region, 811 is a gate electrode of an n-channel TFT, 812 is a gate electrode of a p-channel TFT and 813 is a gate electrode of a pixel TFT. The gate electrodes 811, 812 and 813 are n-type polysilicon films to which phosphorus or arsenic is added, or a p-type polysilicon to which boron or indium is added. The channel region 810 is formed of a crystalline silicon film obtained in the previous-mentioned respective embodiments.

Also, a CMOS circuit may be a dual gate CMOS circuit in which an n-type polysilicon gate is used in the n-channel TFT and a p-type polysilicon gate is used in the p-channel TFT.

The advantages obtained by thus using the silicon film as the gate electrode reside in that the heat resistance is high, and handling is easy because of the silicon film. Also, a "salicide structure" (also including a "polycide structure") can be taken by using the reaction with the metal film.

In order to obtain such a structure, after the gate electrodes 811, 812 and 813 are formed, side walls 814, 815 and 816 are formed. Then, a metal film (not shown) made of titanium, tungsten or the like is formed, and a heat treatment is conducted to form metal silicides 817, 818 and 819. The metal silicides 817, 818 and 819 are formed in parts of the source and drain regions and the gate electrode.

The structure in which the metal silicide is thus formed in a self alignment manner by using the side wall or the like is called "salicide structure". Such a structure is effective since an ohmic contact with lead-out electrodes (source and drain electrodes, etc.) is excellent.

In the above manner, the first substrate having the pixel matrix area is completed.

The present invention is also applicable to an active matrix display using a thin film diode, an MIM element, a varistor element or the like other than the silicon gate type, the top gate type or the bottom gate type TFT described in the above respective embodiments.

As described in the above respective embodiments, the present invention is applicable to the reflection type or the transmission type liquid crystal display using the semiconductor element having any structures.

(Embodiment 14)

An example in which an AMLCD is structured by using the first substrate (TFT-side substrate) including the structures shown in the embodiments 1 to 13. An appearance of the AMLCD in this embodiment is shown in FIGS. 9A and 9B.

Figure 9A:
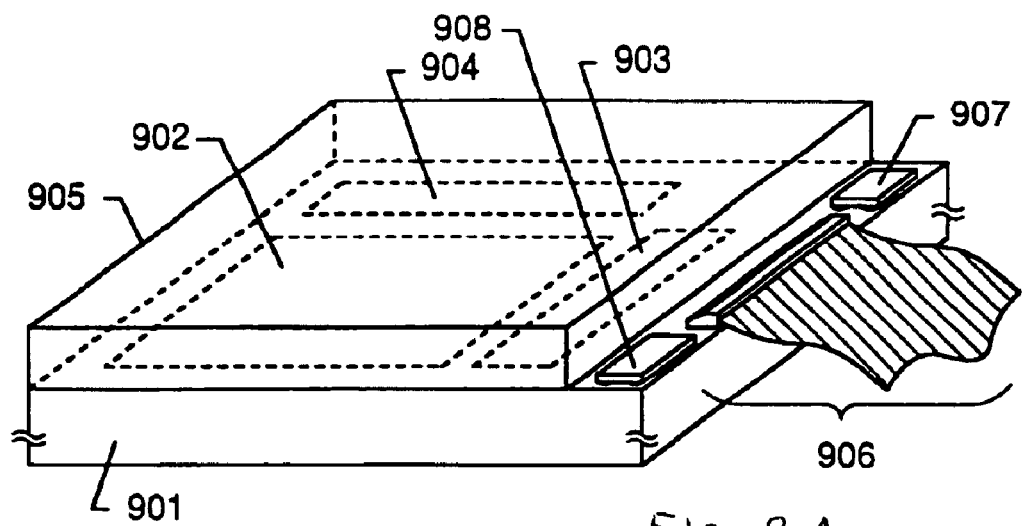
FIGS. 9A and 9B are diagrams each showing the appearance of an AMLCD (Embodiment 14)
Figure 9B:
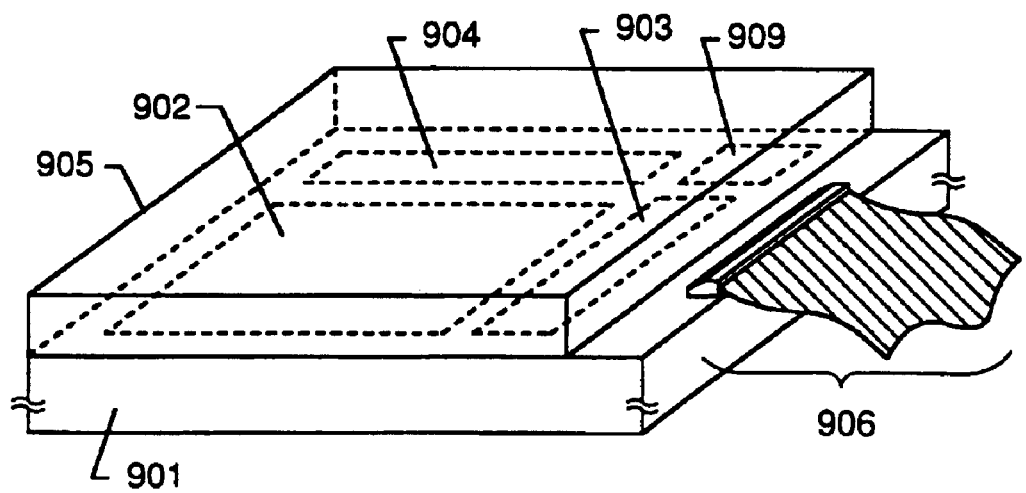

In FIG. 9A, numeral 901 denotes an active matrix substrate in which a pixel matrix 902, a source-side driver circuit 903 and a gate-side driver circuit 904 are formed. It is preferable that the driver circuits are formed of a CMOS circuit where an n-type TFT is complementarily combined with a p-type TFT. Also, numeral 905 denotes an opposed substrate.

The AMLCD shown in FIG. 9A is designed such that the active matrix substrate 901 and the opposed substrate 905 are stuck to each other with the respective edge surfaces being flush. Only a part of the opposed substrate 905 is removed, and an FPC (flexible print circuit) 906 is connected to the exposed active matrix substrate. The FPC 906 allows an external signal to be transmitted to the interior of the circuit.

Also, IC chips 907 and 908 are fitted to a surface of the active matrix substrate 901 to which the FPC 906 is attached. Those IC chips are structured by forming various circuits such as a video signal processing circuit, a timing pulse generating circuit, a gamma correction circuit, a memory circuit, or an arithmetic operating circuit on the silicon substrate. In FIG. 9A, two IC chips are attached, but one chip may be attached or a plurality of chips may be attached.

Also, the structure shown in FIG. 9B may be employed. In FIG. 9B, the same parts as those in FIG. 9A are designated by the same reference. Here an example is shown in which the signal processing conducted by the IC chip in FIG. 9A is conducted by a logic circuit 909 formed of a TFT on the same substrate. In this case, the logic circuit 909 is also basically formed of a CMOS circuit as in the driver circuits 903 and 904.

Also, color display may be conducted using color filters, or liquid crystal may be driven in an ECB (field control birefringence) mode, a GH (guest host) mode or the like without using the color filters.

(Embodiment 15)

The structure of the present invention can be applied to various electro-optic devices or semiconductor circuits other than the AMLCD. For example, as the electro-optic device other than the AMLCD, there are an EL (electro-luminescence) display device, an image sensor and so on. Also, as the semiconductor circuit, there are an arithmetic operation processing circuit such as a micro-processor formed of an IC chip; and a high-frequency module (MMIC, etc.) dealing with an input/output signal of a portable device.

In this way ,the present invention can be applied to all the semiconductor devices that are operative with the circuit formed of insulating gate TFT.

(Embodiment 16)

The CMOS circuit and the pixel matrix formed according to the present invention can be applied to various electro-optic devices (active matrix liquid-crystal display, active matrix EL display, active matrix electrochromic display). That is, the present invention can be implemented by all of electronic devices with which those electro-optic devices are assembled as display medium.

As such electronic devices, there are a video camera, a digital camera, a projector (rear type or front type), a head mount display (goggle type display), a navigation system for vehicles, a personal computer, a portable information terminal (mobile computer, a portable telephone, an electronic book or the like). Those examples are shown in FIGS. 10A to 10F and 11A to 11D.

Figure 10A:
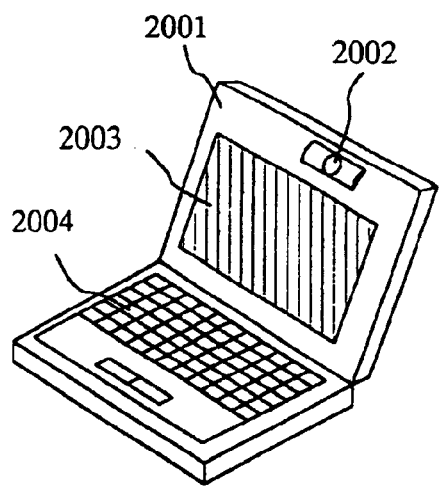
FIGS. 10A to 10F are diagrams showing an example of electronic devices (Embodiment 16)

FIG. 10A shows a personal computer made up of a main body 2001, an image input unit 2002, a display device 2003 and a key board 2004. The present invention can be applied to the image input unit 2002, the display device 2003 and other signal control circuits.

Figure 10B:
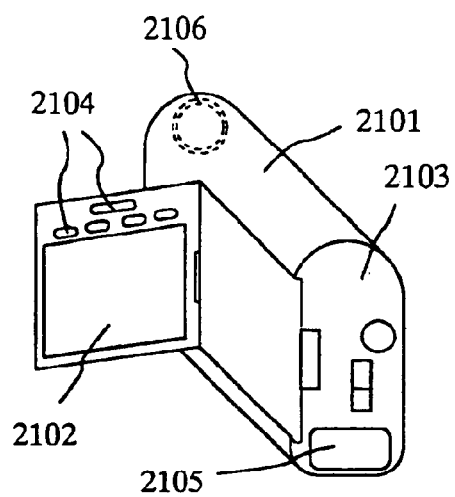

FIG. 10B shows a video camera made up of a main body 2101, a display device 2102, an audio input unit 2103, an operation switch 2104, a battery 2105 and an image receiving unit 2106. The present invention can be applied to the display device 2102, the audio input unit 2103 and other signal control circuits.

Figure 10C:
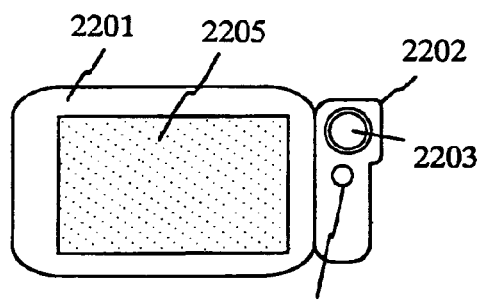

FIG. 10C shows a mobile computer made up of a main body 2201, a camera unit 2202, an image receiving unit 2203, an operation switch 2204, and a display device 2205. The present invention can be applied to the display device 2205 and other signal control circuits.

Figure 10D:
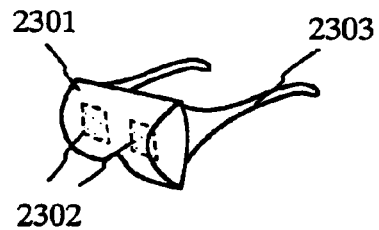

FIG. 10D shows a goggle type display made up of a main body 2301, a display device 2302 and an arm unit 2303. The present invention can be applied to the display device 2302 and other signal control circuits.

Figure 10E:
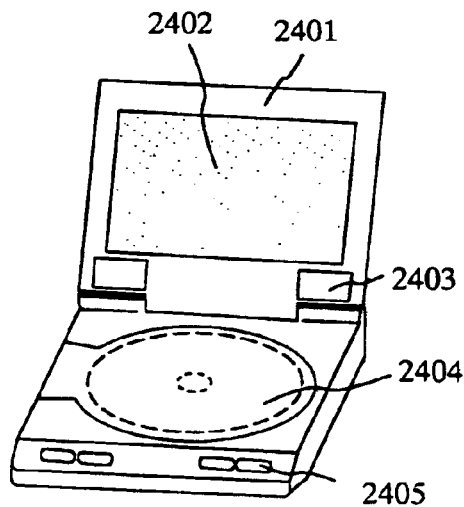

FIG. 10E shows a player that employs a recording medium on which program is recorded (hereinafter referred to as "recording medium") which is made up of a main body 2401, a display device 2402 and a speaker unit 2403, a recording medium 2404, and an operation switch 2405. The player has a function to enjoy music, movie, game and the internet using a DVD (digital versatile disc), a CD or the like as the recording medium. The present invention can be applied to the display device 2402 and other signal control circuits.

Figure 10F:
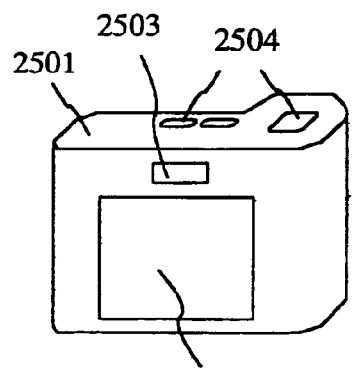

FIG. 10F shows a digital camera made up of a main body 2501, a display device 2502, an eye piece unit 2503, an operation switch 2504 and an image receiving unit (not shown). The present invention can be applied to the display device 2502 and other signal control circuits.

Figure 11:
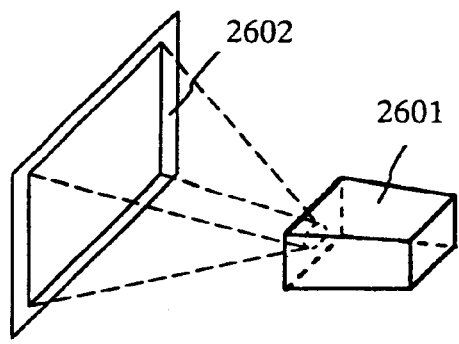
FIGS. 11A to 11D are diagrams showing examples of projectors and their structures.
Figure 11:
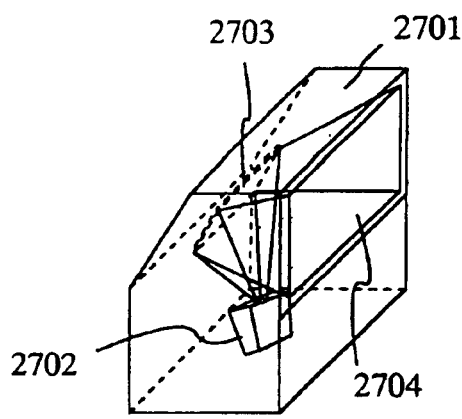

FIG. 11A shows a front type projector made up of a light source optical system and display device 2601 and a screen 2602. The present invention can be applied to the display device and other signal control circuits.

FIG. 11B shows a rear type projector made up of a main body 2701, a light source optical system and display device 2702, a mirror 2703 and a screen 2704. The present invention can be applied to the display device and other signal control circuits.

Figure 11C:
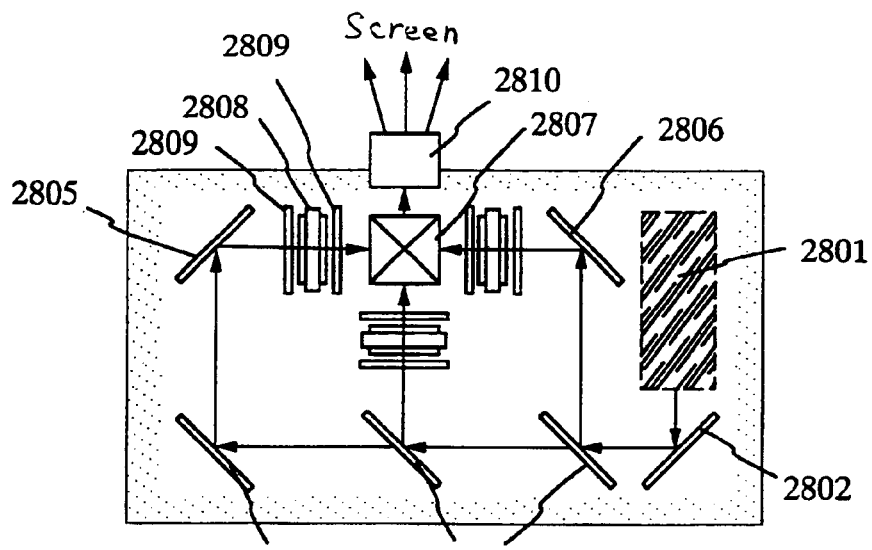
Figure 11:
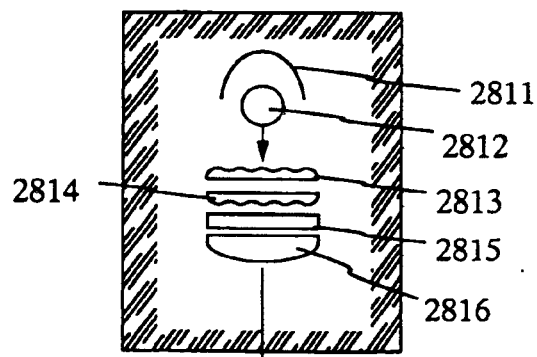

FIG. 11C is a diagram showing an example of the structure of the light source optical system and display devices 2601 and 2702 in FIGS. 11A and 11B. The light source optical system and display device 2601 and 2702 are made up of a light source optical system 2801, mirrors 2802 and 2804 to 2806, a dichroic mirror 2803, an optical system 2807, display devices 2808, phase difference plates 2809 and a projection optical system 2810. The projection optical system 2810 is made up of a plurality of optical lenses having a projection lens. This structure is called "three plate type" because three display devices 2808 are used. Also, an implementor may appropriately dispose an optical lens, a film having a polarization function, a film for adjusting a phase difference, an IR film, etc., in an optical path indicated by an arrow in FIG. 11C.

FIG. 11D is a diagram showing an example of the structure of the light source optical system 2801 in FIG. 11C. In this embodiment, the light source optical system 2801 is made up of a reflector 2811, a light source 2812, lens arrays 2813, 2814, a polarization conversion element 2815 and a condenser lens 2816. The light source optical system shown in FIG. 11D is an example and the present invention is not particularly limited thereto. For example, an implementor may appropriately dispose an optical lens, a film having a polarization function, a film for adjusting a phase difference, an IR film, etc., in the light source optical system.

Figure 12A:
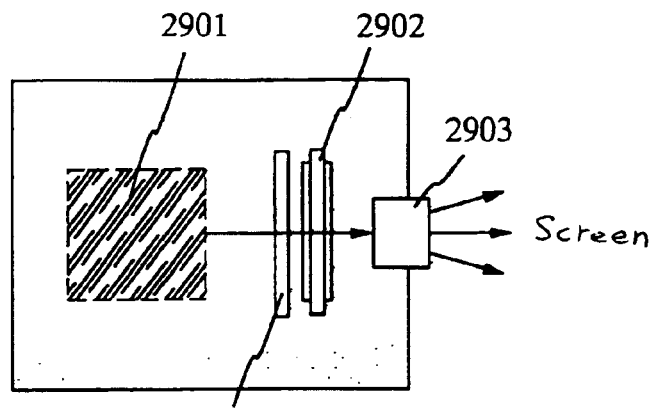
FIGS. 12A to 12C are diagrams showing the structures of the projectors.

FIG. 11C shows the example of the three-plate type but FIG. 12A shows an example of a single-plate type. The light source optical system and display device shown in FIG. 12A is made up of a light source optical system 2901, a display device 2902 and a projection optical system 2903. The projection optical system 2903 is made up of a plurality of optical lenses having a projection lens. The light source optical system and display device shown in FIG. 12A can be applied to the light source optical system and display devices 2601 and 2702 in FIGS. 11A and 11B. Also, the light source optical system 2901 may employ the light source optical system shown in FIG. 11D. The display device 2902 is provided with color filters (not shown) so that a display image is colored.

Figure 12B:
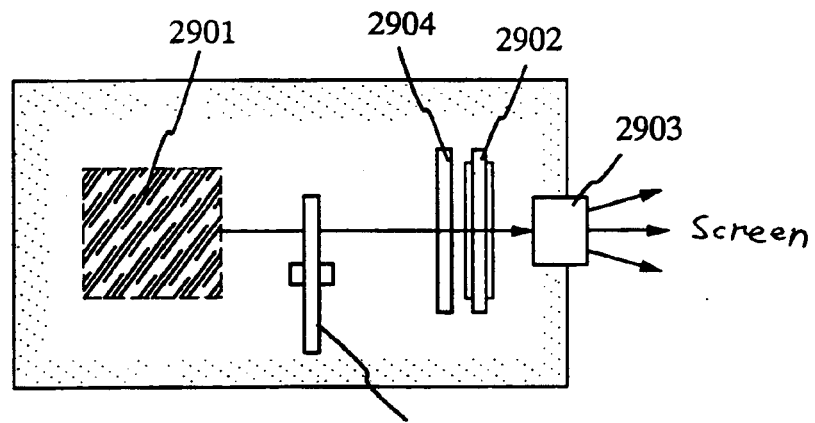

Also, the light source optical system and display device shown in FIG. 12B is an application example of FIG. 12A, in which the color filters are replaced by a revolution color filter disc 2905 of RGB to color a display image. The light source optical system and display device shown in FIG. 12B can be applied to the light source optical system and display devices 2601 and 2702 in FIGS. 11A and 11B.

Figure 12C:
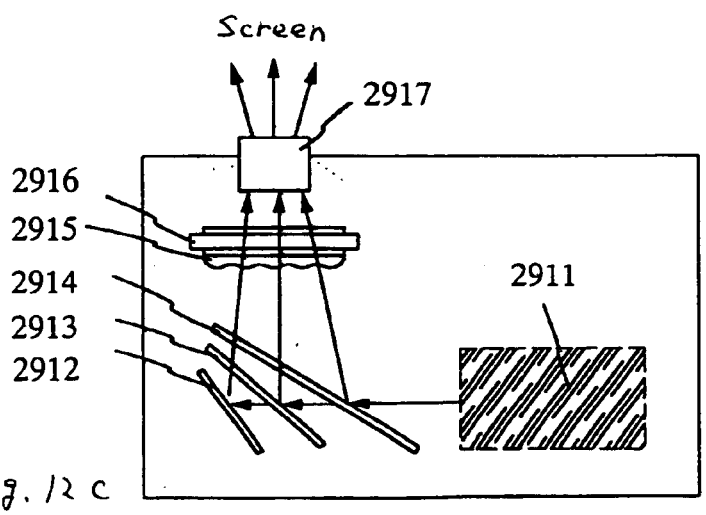

The light source optical system and display device shown in FIG. 12C is called "color filterless single-plate type". In this type, a display device 2916 is provided with a micro-lens array 2915, and a display image is colored by using a dichroic mirror (green) 2912, dichroic mirror (red) 2913 and a dichroic mirror (blue) 2914. A projection optical system 2917 is made up of a plurality of optical lenses having a projection lens. The light source optical system and display device shown in FIG. 12C can be applied to the light source optical system and display devices 2601 and 2702 in FIGS. 11A and 11B. Also, as the light source optical system 2911, there may be used an optical system having a coupling lens and a collimator lens in addition to the light source.

As described above, the applied field of the present invention is extremely large and the present invention can be applied to electronic devices in any fields.

As described above, according to the present invention, there can be obtained a crystalline silicon film having an excellent crystallinity over a wide area in a short period of time. Also, a semiconductor device high in reliability and excellent in performance is obtained by the crystalline silicon film.

Also, the crystal of the crystalline silicon film obtained according to the present invention has the continuity of crystal lattices and an excellent uniformity as compared with the crystalline silicon film obtained by a conventional method (the solid-phase growing method, the laser annealing method, the method of adding a catalytic element and heating, etc.).

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device, comprising:
   a first step of forming a semiconductor film over a substrate;
   a second step of holding a catalytic element that promotes the crystallization of said semiconductor film in contact with an entire surface of said semiconductor film;
   a third step of irradiating a laser beam shaped in a rectangle or a square while moving the laser beam from one side of said semiconductor film toward another side thereof to sequentially crystallize said semiconductor film to form a crystalline semiconductor film;

a fourth step of patterning said semiconductor film to form at least first and second semiconductor islands after the irradiation of the laser beam, a fifth step of forming a first thin film transistor using said first semiconductor island, and forming a second thin film transistor using said second semiconductor island, and a sixth step of forming a portion of a pixel matrix circuit comprising said first thin film transistor, and forming a portion of a driving circuit comprising said second thin film transistor, wherein said laser beam has an irradiation area of 10 cm$^2$ or more.

2. A method of manufacturing a semiconductor device, comprising:

a first step of forming a semiconductor film on a substrate having an insulating surface;

a second step of holding a catalytic element that promotes the crystallization of said semiconductor film in contact with an entire surface of said semiconductor film;

a third step of irradiating a laser beam shaped in a rectangle or a square from one side of said semiconductor film toward another side thereof while moving said substrate to sequentially crystallize said semiconductor film to form a crystalline semiconductor film, a fourth step of patterning said semiconductor film to form at least first and second semiconductor islands after the irradiation of the laser beam, a fifth step of forming a first thin film transistor using said first semiconductor island, and forming a second thin film transistor using said second semiconductor island, and a sixth step of forming a portion of a pixel matrix circuit comprising said first thin film transistor, and forming a portion of a driving circuit comprising said second thin film transistor, wherein said laser beam has an irradiation area of 10 cm$^2$ or more.

3. A method of manufacturing a semiconductor device, comprising:

a first step of forming a semiconductor film over a substrate;

a second step of holding a catalytic element which promotes the crystallization of said semiconductor film in contact with an entire surface of said semiconductor film;

a third step of irradiating a laser beam whose irradiation area in one shot is 10 cm$^2$ or more to said semiconductor film to crystallize said semiconductor film and to form a crystalline semiconductor film;

a fourth step of conducting a thermal oxide processing in an oxide atmosphere to form an oxide film on the surface of said crystalline semiconductor film and gettering said catalytic element to said oxide film to remove or reduce said catalytic element existing in said crystalline semiconductor film;

a fifth step of patterning said semiconductor film to form at least first and second semiconductor islands after the irradiation of the laser beam, a sixth step of forming a first thin film transistor using said first semiconductor island, and forming a second thin film transistor using said second semiconductor island, and a seventh step of forming a portion of a pixel matrix circuit comprising said first thin film transistor, and forming a portion of a driving circuit comprising said second thin film transistor.

4. A method of manufacturing a semiconductor device as claimed in claim 3, further comprising a step of removing said oxide film after said fourth step.

5. A method of manufacturing a semiconductor device, comprising:

a first step of forming a semiconductor film over a substrate;

a second step of holding a catalytic element which promotes the crystallization of said semiconductor film in contact with an entire surface of said semiconductor film;

a third step of irradiating a laser beam whose irradiation area in one shot is 10 cm$^2$ or more to said semiconductor film to crystallize said semiconductor film and to form a crystalline semiconductor film;

a fourth step of selectively adding phosphorus or boron to said crystalline semiconductor film and gettering said catalytic element to said added region by conducting a heat treatment to remove or reduce said catalytic element existing in said crystalline semiconductor film;

a fifth step of patterning said semiconductor film to form at least first and second semiconductor islands after the irradiation of the laser beam, a sixth step of forming a first thin film transistor using said first semiconductor island, and forming a second thin film transistor using said second semiconductor island, and a seventh step of forming a portion of a pixel matrix circuit comprising said first thin film transistor, and forming a portion of a driving circuit comprising said second thin film transistor.

6. A method of manufacturing a semiconductor device as claimed in claim 1, 2, 3, or 5, wherein a pulse width of the laser beam irradiated in the third step is 600 nsec to 1 msec.

7. A method of manufacturing a semiconductor device as claimed in claim 1, 2, 3, or 4, wherein a laser energy density of the laser beam irradiated in the third step is 100 to 800 mJ/cm$^2$.

8. A method of manufacturing a semiconductor device as claimed in claim 1, 2, 3, or 5, wherein said catalytic element is at least one element selected from a group consisting of Fe, Co, Ni, Ru, Rh, Pd, Os, Ir, Pt, Cu, Au, Ge, Pb and In.

9. A method of manufacturing a semiconductor device as claimed in claim 1, 2, 3, or 5, wherein said semiconductor film comprises silicon.

10. A method of manufacturing a semiconductor device as claimed in claim 1, 2, 3, or 5, wherein said crystalline semiconductor film has crystals of which crystal lattices are continuously coupled with each other.

11. A method of manufacturing a semiconductor device comprising the steps of:

forming a semiconductor film comprising amorphous silicon on an insulating surface;

providing an entire surface of said semiconductor film with a crystallization promoting material comprising a metal;

crystallizing said semiconductor film by irradiating said semiconductor film with a pulsed laser beam, patterning said semiconductor film to form at least first and second semiconductor islands after the irradiation of the laser beam, forming a first thin film transistor using said first semiconductor island, and forming a second thin film transistor using said second semiconductor island, and forming a portion of a pixel matrix circuit comprising said first thin film transistor, and forming a portion of a driving circuit comprising said second thin film transistor, wherein said laser beam has a pulse width of 200 nsec or more, and wherein said laser beam has an irradiation area of 10 cm$^2$ or more.

12. A method of manufacturing a semiconductor device comprising the steps of:

forming a semiconductor film on an insulating surface;

providing an entire surface of said semiconductor film with a crystallization promoting material comprising a metal;

crystallizing said semiconductor film by irradiating said semiconductor film with a pulsed laser beam having a square shape cross section, patterning said semiconductor film to form at least first and second semiconductor islands after the irradiation of the laser beam, forming a first thin film transistor using said first semiconductor island, and forming a second thin film transistor using said second semiconductor island, and forming a portion of a pixel matrix circuit comprising said first thin film transistor, and forming a portion of a driving circuit comprising said second thin film transistor, wherein said laser beam has a pulse width of 200 nsec or more, and an irradiation area of said laser beam is 10 cm$^2$ or more.

13. The method according to claim 11 or 12 wherein said metal is selected from the group consisting of Fe, Co, Ni, Ru, Rh, Pd, Os, Ir, Pt, Cu, Au, Ge, Pb and In.

14. The method according to claim 11 or 12 wherein an energy density of said laser beam at an irradiation area of said semiconductor film is 100 to 800 mJ/cm$^2$.

* * * * *